(12) United States Patent
Gossweiler, III et al.

(10) Patent No.: US 8,350,848 B2
(45) Date of Patent: Jan. 8, 2013

(54) LIGHTWEIGHT THREE-DIMENSIONAL DISPLAY

(75) Inventors: Richard C. Gossweiler, III, Sunnyvale, CA (US); Mark A. Limber, Boulder, CO (US); Brian E. Brewington, Fort Collins, CO (US); Matthew W. Lowrie, Louisville, CO (US)

(73) Assignee: Trimble Navigation Limited, Sunnyvale, CA (US)

( * ) Notice: Subject to any disclaimer, the term of this patent is extended or adjusted under 35 U.S.C. 154(b) by 0 days.

(21) Appl. No.: 13/367,199

(22) Filed: Feb. 6, 2012

(65) Prior Publication Data

US 2012/0133653 A1     May 31, 2012

Related U.S. Application Data

(63) Continuation of application No. 12/053,399, filed on Mar. 21, 2008, now Pat. No. 8,125,481.

(51) Int. Cl.
*G06T 15/00* (2011.01)
*G06T 13/00* (2011.01)

(52) U.S. Cl. .................................... 345/419; 345/473
(58) Field of Classification Search .............. 345/418, 345/419, 427, 473
See application file for complete search history.

(56) References Cited

U.S. PATENT DOCUMENTS

| | | | |
|---|---|---|---|
| 5,808,613 A | 9/1998 | Marrin et al. | |
| 6,044,367 A | 3/2000 | Wolff | |
| 6,346,938 B1 | 2/2002 | Chan et al. | |
| 6,535,226 B1 | 3/2003 | Sorokin et al. | |
| 6,664,986 B1 | 12/2003 | Kopelman et al. | |
| 6,804,699 B1 | 10/2004 | Henrie | |
| 6,912,490 B2 | 6/2005 | Dodge | |
| 6,931,604 B2 | 8/2005 | Lane | |
| 6,977,651 B1 | 12/2005 | Matsumoto et al. | |
| 6,983,064 B2 | 1/2006 | Song | |
| 7,080,325 B2 | 7/2006 | Treibach et al. | |
| 7,148,892 B2 | 12/2006 | Robertson et al. | |
| 7,269,285 B2 | 9/2007 | Bober et al. | |
| 7,388,986 B2 | 6/2008 | Bober et al. | |
| 7,502,027 B1 | 3/2009 | Chin et al. | |
| 7,523,392 B2 | 4/2009 | Dunietz et al. | |
| 2002/0010655 A1 | 1/2002 | Kjallstrom | |
| 2003/0014442 A1 | 1/2003 | Shiigi et al. | |
| 2003/0031380 A1 | 2/2003 | Song | |
| 2004/0123154 A1 | 6/2004 | Lippman et al. | |

(Continued)

FOREIGN PATENT DOCUMENTS

WO    WO9938063 A1    7/1999

OTHER PUBLICATIONS

Official Action for U.S. Appl. No. 13/367,226, dated Jun. 7, 2012, 6 pages.

(Continued)

*Primary Examiner* — Ryan R Yang
(74) *Attorney, Agent, or Firm* — Sheridan Ross P.C.

(57) ABSTRACT

A computer-implemented imaging process method includes generating a progression of images of a three-dimensional model and saving the images at a determined location, generating mark-up code for displaying image manipulation controls and for permitting display of the progression of images in response to user interaction with the image manipulation controls, and providing the images and mark-up code for use by a third-party application.

17 Claims, 18 Drawing Sheets

U.S. PATENT DOCUMENTS

| | | | |
|---|---|---|---|
| 2005/0060351 | A1 | 3/2005 | Rahman |
| 2005/0188361 | A1 | 8/2005 | Cai et al. |
| 2006/0114251 | A1 | 6/2006 | Miller |
| 2006/0242121 | A1 | 10/2006 | DeVorchik et al. |
| 2007/0198713 | A1 | 8/2007 | Tsao et al. |
| 2007/0211149 | A1 | 9/2007 | Burtnyk et al. |
| 2008/0016145 | A1 | 1/2008 | Takase et al. |
| 2008/0033641 | A1* | 2/2008 | Medalia .................... 701/209 |
| 2008/0065685 | A1 | 3/2008 | Frank |
| 2008/0147671 | A1 | 6/2008 | Simon et al. |
| 2008/0168098 | A1 | 7/2008 | Paul |
| 2008/0319943 | A1 | 12/2008 | Fischer |
| 2009/0100149 | A1 | 4/2009 | Arnold et al. |
| 2009/0158178 | A1 | 6/2009 | Birsan et al. |

OTHER PUBLICATIONS

International Search Report & Written Opinion for Application No. PCT/US2009/037891, dated Nov. 4, 2009, 11 pages.

Supplementary European Search Report for EP09723279 dated Dec. 30, 2011, 3 pages.

International Search Report & Written Opinion for Application No. PCTIUS2009/037886, dated 1012712009, 12 pages.

English translation of Official Action for China Patent Application No. 200980117744.9, dated Jun. 15, 2012 5 pages.

English translation of Official Action for China Patent Application No. 200980117659.2, dated Jul. 3, 2012 2 pages.

Official Action for U.S. Appl. No. 13/419,626, dated Jun. 19, 2012, 8 pages.

Notice of Allowance for U.S. Appl. No. 13/367,226, mailed Sep. 5, 2012, 5 pages.

* cited by examiner

LIGHTWEIGHT THREE-DIMENSIONAL DISPLAY

CROSS-REFERENCE TO RELATED APPLICATION

This application is a continuation of U.S. patent application Ser. No. 12/053,399, filed on Mar. 21, 2008, which is herein incorporated by reference in its entirety.

TECHNICAL FIELD

This document relates to systems and techniques for developing representations of real world objects that appear three-dimensional but can be displayed without special three-dimensional techniques.

BACKGROUND

If a picture is worth a thousand words, a three-dimensional model may be worth a million. Computer models, developed on computer-aided design and development (CADD) systems, are used in a variety of industries to help people better understand and visualize the object being modeled, without requiring someone to build that object. For example, architects can generate virtual walkthrough tours of buildings before they are built so that clients can visualize internal spaces and also see how a building might look on its site. Engineers can build whole systems to better see how various parts will fit together. And biologists and chemists can build objects that already exist but that are too small to be seen easily, such as molecules.

Processing of three-dimensional models requires extensive computational capabilities, however. That is because an enormous number of faces on an object may need to be computed (i.e., whether a surface is visible, etc.), as does the way that light interacts with and reflects off of those surfaces. Also, a user may need to install particular software to handle the display of three-dimensional models, such as VRML or Quicktime VR. The model can also be turned into a movie that requires less processing power to display, but in that case, the user may lose the ability to interact freely with the model.

SUMMARY

This document describes systems and techniques that may be used to generate a three-dimensional experience for a user without the need for special three-dimensional software. For example, a user may be allowed to manipulate a model in space in a web browser without needing special software such as a FLASH plug-in or the like.

In general, the techniques discussed here generate a plurality of images of a model in a seamless procession and place those images in a defined location. The techniques then generate web browser code, such as HTML code, that produces controls for cycling through the images and also points to the particular images. The code can then be accessed from a web browser (e.g., by pointing the browser to the URL for the code).

In certain implementations, such systems and technique may provide one or more advantages. For example, developers may develop pages by which users can interact with three-dimensional models—represented as a series of two-dimensional figures—without having to worry about whether the users will have particular software programs or plug ins. Consumers may be enabled to have a richer interactive experience on a variety of devices without needing the computational horsepower for full three-dimensional modeling and without having to install and maintain particular software. As a result, a typical user may be provided with a richer experience in viewing a web page.

In one implementation, a computer-implemented imaging method is disclosed. The method comprises generating a progression of images of a three-dimensional model and saving the images at a determined location, generating mark-up code for displaying image manipulation controls and for permitting display of the progression of images in response to user interaction with the image manipulation controls, and providing the images and mark-up code for use by a third-party application. The third-party application can comprise a web browser, and the web browser can permit interaction with the images in the web browser's native form.

In some aspects, generating the seamless progression of images comprises directing a three-dimensional modeling application to take pictures in a loop around a perimeter of the three-dimensional model. The method can also comprise packaging the images and mark-up code for transmission to a remote third-party application. In addition, the method can include transmitting to the third-party application a URL for the mark-up code. The method can further involve receiving from a user an indicator relating to a number of images to generate around an exterior of the three-dimensional object and generating the images at substantially equally spaced positions around the exterior of the three-dimensional object. In addition, the method can further include storing each image of the plurality of images as a separate image file, and generating the mark-up code to refer to the image files.

In some aspects, the mark up code can be executed by a native web browser without using browser plug ins. The method can also comprise receiving, from a user, an indication of an image traversal path and generating the progression of images along the image traversal path. The image traversal path can be defined by points distributed in multiple dimensions about a sphere at time. The method can also include generating a display in a browser associated with the model, receiving user parameters identifying the determined location, and communicating the determined location to an operating system.

In another implementation, a computer-implemented model viewing system is disclosed. The system includes a CAD program adapted to generate two-dimensional images of a three-dimensional model, an image generation module to cause a plurality of two-dimensional images of the three-dimensional model to be created by the CAD program, and a code generator to create mark up code that, when executed, causes a progression of the two-dimensional images to be displayed so as to create a visual impression of movement of the three-dimensional model. The image generation module can define an imaging path about the three-dimensional model and a virtual camera operated by the CAD program is operable to be controlled by the image generation module to capture images from locations corresponding to the imaging path. In addition, the system can include a web browser capable of displaying the progression of the two-dimensional images in the browser's native form. The system can also include means for communicating a user selection of a storage location for the two-dimensional images from a web-based application to a computer operating system.

In certain aspects, the image generation module is programmed to capture and save digital images having a pre-defined naming structure so that the images may be accessed in sequence by name. In yet other aspects, the code generator creates the code using a code template and provides model-specific information for use with the code template.

In yet another implementation, a computer-implemented model viewing system is disclosed, and comprises an interface configured to receive user input regarding imaging of a three-dimensional model into a plurality of images, a plug in application to communicate with an application displaying the three-dimensional model so as to cause the application to generate a plurality of images of the three-dimensional model, and means for generating mark up code for displaying the plurality of images in progression. The system can further comprise means for communicating between an browser-based application and an operating system file system to identify a location for saving the plurality of images.

The details of one or more embodiments are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

This section describes various systems and techniques for generating representations of 3-D models, where the representations can be displayed in a manner very much like a display of the model itself, but without the computational overhead associated with manipulating a true 3-D model. In the examples discussed here, a plug-in for a 3-D CADD system or similar application causes the system to orbit a model while capturing images of the model, so as to create multiple images from roughly evenly-spaced vantage points around the model. The plug-in can then automatically generate mark up code that permits easy manipulation of the 2-D images from a web browser, so that the images can be displayed in order to provide the effect of a 3-D object that is being spun around by a user in real time.

The plug-in may operate, in certain circumstances, by opening a browser window that an operator may use in setting parameters for creating images of the model. As one example, the operator may select a folder or other location into which files associated with the imaging process are to be placed, so that they may be accessed later for viewing. Such an approach is not trivial because generally, a web page does not have access to a file system on a computer, or the access depends on the type of computer on which the page is being displayed. However, in techniques described below, the web page code, such as JavaScript code, may communicate with a native application that is loaded on the computer system and serves as a conduit for the web page program. The web page code may cause the native application to interact with a file management system on the computer, so that the web page code may have access, indirectly, to files on the computer.

Figure 1:
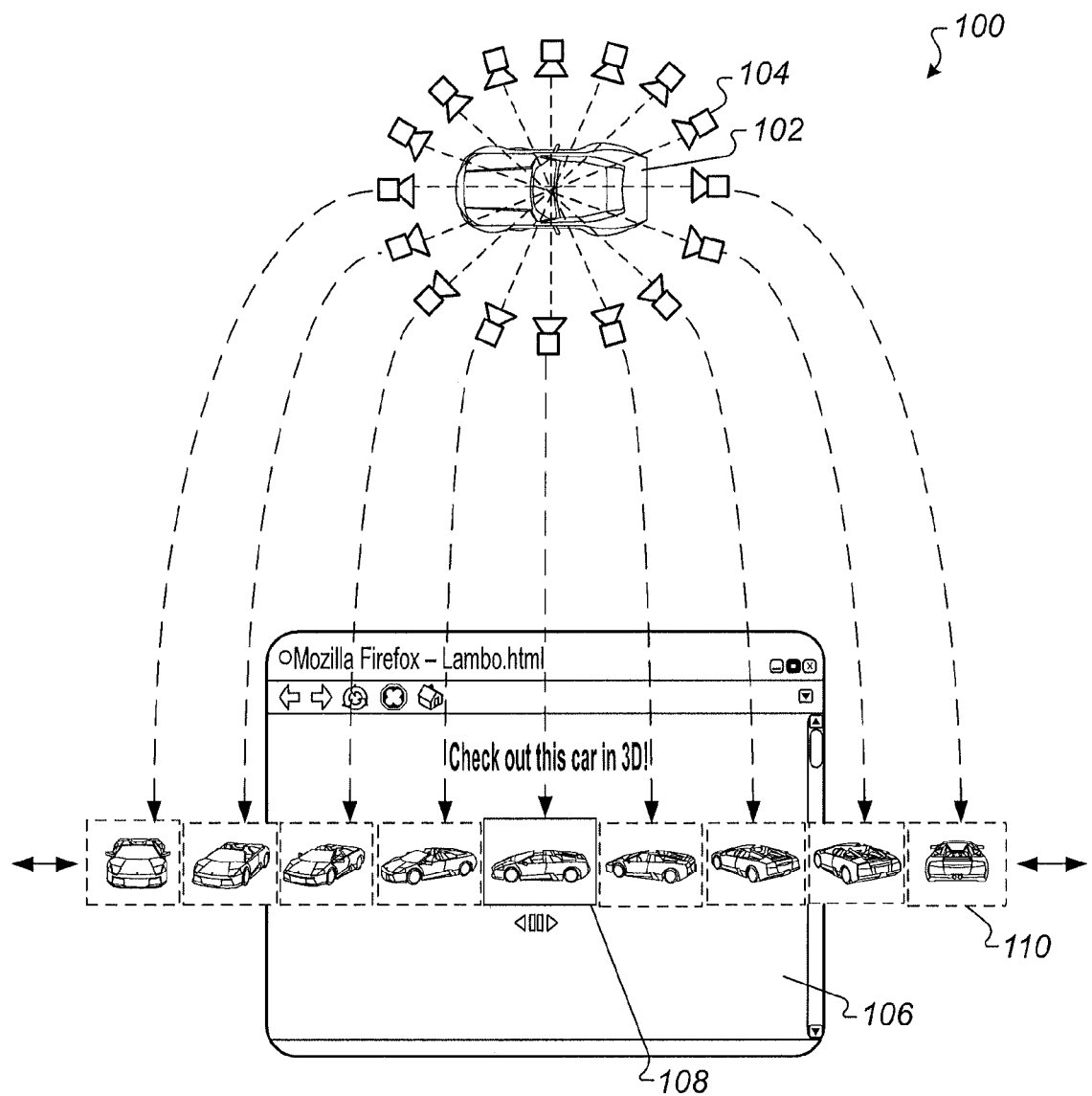
FIG. 1 is a conceptual diagram of a process for capturing a 3-D model for display as a series of 2-D images.

FIG. 1 is a conceptual diagram of a process 100 for capturing a 3-D model for display as a series of 2-D images. In this representation, a model 102 of an automobile, here a Lamborghini, is shown from above. However, the model will be understood to be a 3-D model that may be rendered in a CADD system and may be viewed from a variety of angles. A number of cameras 104 are shown around the model to depict the generation of images of the model from various angles. The cameras 104 are positioned at roughly equal divisions around the perimeter of the model 102, and at a distance such that the entire model will be imaged in any virtual photo taken of the model 102 by the cameras 104. The height of the cameras relative to the model can be set or can be selected by the user—also, different cameras 104 around the model 102 can be at different heights from each other.

The number of cameras 104 may be selected, such as by a user, to provide a number of two-dimensional images of the 3-D model 102 such that flipping from one image to the next will provide a relatively smooth rendering of the model. In particular, a user may selectively cycle through images taken by adjacent cameras in a progressive manner, to create a virtual animation of the model. Where the model is placed against a white or invisible background for the imaging, such flipping from image to image will make it appear to a viewer like the model is rotating freely in space. As a result, the visual effects for the viewer is somewhat like that provided by old flip-books or by the popular movie The Matrix, except with the model appearing to rotate in space, rather than the camera appearing to move about the model.

A webpage 106 is shown conceptually below the model 102. In concept, the webpage 106 is shown to represent the manner that the images of the model 102 may be displayed to a user of a web browser after the imaging operation has occurred.

The webpage 106 includes a display area 108 where images of the model 102 may be displayed to a viewer of the web browser. Other adjacent images, such as image 110, are shown in the figure next to image 108. In actuality, the other images would not be viewable to a user when image 108 is being displayed. Rather, the other images are shown conceptually here in the form of a filmstrip to indicate that, when a user manipulates controls below image 108, the other images will be displayed in order. As a result of such progressive display of the images, the user may generate the visual effect of rotating the model in space within the area shown for image 108, simply by causing the various adjacent images to be displayed in an appropriate order. In certain examples, the user may flip back and forth quickly between the images, with the result being that the object appears to be grasped and rotated in front of the user. In reality, however, the user will simply be viewing the individual images in sequence in a common area on their browser.

Because the webpage 106 displays static images rather than actual three-dimensional models or complex animations such as flash-based animations, a user may view webpage 106 in certain circumstances without the need for any particular web browser plug-ins. For example, the techniques discussed here may permit a user to obtain Flash effects without the need for Flash. Also, a user may be able to achieve such seeming three-dimensional control on a light weight client, such as a mobile device or other computing device that has limited computational power.

Figure 2:
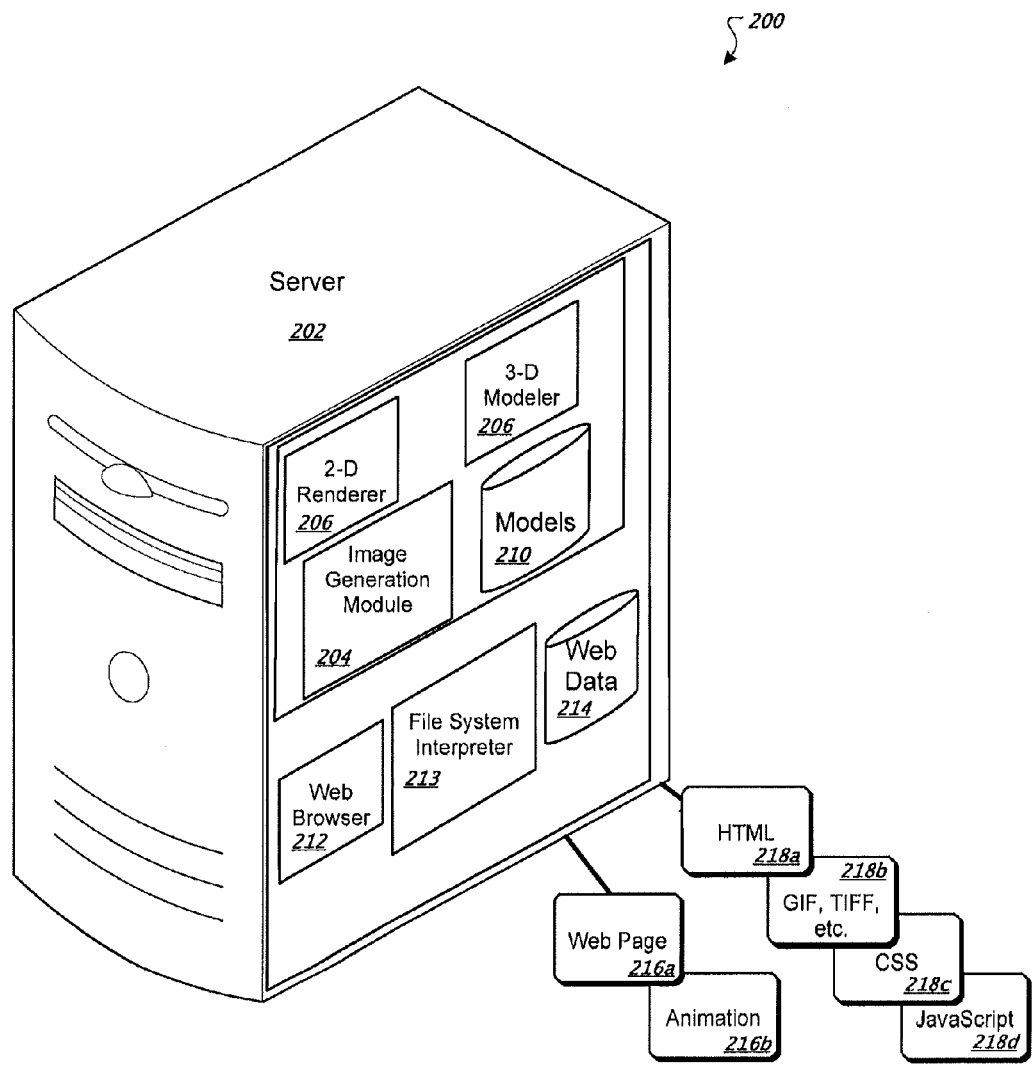
FIG. 2 is a block diagram of an illustrative image capture system.

FIG. 2 is a block diagram of an illustrative image capture system 200. The system 200 generally includes a number of components in a computer system that are adapted to generate a collection of files, including images of a 3-D model and code for generating views of those images, and for running the code and displaying the images. Although shown in this example as a single computer, the various components may reside on one or more computers and may be managed by different entities. For example, programs for generating images and code for viewing the images may be operated by a first entity, while programs for running the code and viewing the images may be operated by a different entity.

The system 200 includes an imaging computer 202 that includes, for example, a 3-D modeler 208. The 3-D modeler 208 may comprise any of a variety of computer-aided design programs that permit the construction of 3-D objects and the viewing of such objects. In addition, in certain implementations, the 3-D modeler 208 may include functionality to generate images of models rendered by the system. Such functionality may commonly include an interface that permits a user to position a viewpoint and an angle of view for a virtual camera, and may also permit the definition of a field of view, such as by selecting a virtual lens for the camera.

Control of such a virtual camera and generation of 2-D images of the 3-D model may occur with a 2-D renderer 206. The 2-D renderer 206 may create a standard image file, such as a JPEG file, in response to commands to provide an image of a model from a particular point at a particular angle. The 2-D renderer 206 may also accept commands, such as commands received through an application programming interface (API). For example, another program may operate according to the API to control the positioning of a virtual camera by the 3-D modeler 208, and the generation of images by the 2-D renderer 206.

Models for the 3-D modeler 208 may be stored in a models database 210. The database 210 may take a variety of forms, and may store each model in a separate file. Various models may be combined into one common model, such as by providing each model with a particular base point, and opening multiple models into a single model space. When such multiple models are opened near each other, imaging of the multiple models may occur using 2-D renderer 206. Database 210 may be implemented, for example, like the model warehouse component of GOOGLE SKETCHUP.

An image generation module 204 may operate, such as through an API as described above, to cause automatic rendering of images by the 2-D renderer 206 through the 3-D modeler 208. The image generation module 204 may be programmed, for example, to interact with a user or an application in identifying locations around a model for placing a virtual camera, and a number of different images that are to be captured of the model. The image generation module 204 may be a native program that has been installed on the computer 202, and that runs separately of other programs on the computer 202. In one example, the image generation module may be written in a language such as Ruby.

The image generation module 204 may, in one implementation, cause a dialog box to be generated for interacting with the user. The dialog box may take a variety of forms, and in one example, may take the form of a borderless web browser 212. The web browser 212 may operate in a familiar manner as one of a number of common browsers, such as the MICROSOFT INTERNET EXPLORER, the FOXFIRE browser, or the APPLE SAFARI browser. In appropriate circumstances, the browser may operate according to the techniques described in this document, without the need for additional plug-ins or other components.

Pages within the web browser 212 may have difficulty accessing data on the computer 203 because of security restrictions that are part of the Web browser. As a result, a file system interpreter 213 may be provided on the computer 202. In one example, the file system interpreter 213 is part of or associated with the image generation module 204, and may be part of a native application, such as an application written in Ruby, running on the computer 202.

The file system interpreter 213 is configured to communicate with a program running on the web browser 212, such as JavaScript code running on the web browser 212. The JavaScript and Ruby programs may communicate according to a prearranged communication protocol. Using such a protocol, the JavaScript running on the web browser 212 may make requests of the file system interpreter 213 that may be interpreted by the file system interpreter 213. For example, the JavaScript code or other similar code running on the web browser 212 may request information about files on computer 202. Such a request may include a request to determine the folder structure on the computer 202. The file system interpreter 213 may respond to such requests by making a standard operating system request for data for a file system dialog box. Upon receiving data associated with the dialog box, the file system interpreter 213 may parse such data to determine a file structure on the computer 202, and may return such information to the application running on the web browser 212. For example, the file system interpreter 213 may pass a list of folders in a particular directory to the application running on the web browser 212.

The application running on the web browser 212 may take such information and display it in a manner that appears to a user as if an actual file system has been accessed by the program running on the web browser 212. For example, the program may generate a borderless webpage that has the appearance of a file dialog box, and may access a number of stored images to show icons such as folders and other similar organization for a file system. The program may also display, with the icons, textual description of the folders, so that a user is presented with a webpage that looks like a file system dialog box.

As described in more detail below, user interaction with the webpage may include commands from the user, such as requests to save files in a particular folder, requests to create a new folder, or requests to move up and down in a folder hierarchy. Such requests may be interpreted by the program running on the Web browser 212 and passed to the file system interpreter 213 according to an agreed-upon protocol. The file system interpreter 213 may translate such requests and in turn make certain calls to a file system on an operating system for the computer 202. For example, the file system interpreter 213 may drill down in a set of folders in response to a user selection, and may pass back to the program running on the web browser 212 a new list of subfolders or other appropriate information. In general, each time that the user interacts with the webpage that looks like a file system dialog box, the program running on the web browser 212 may make a request to the file system interpreter 213, which may in turn access information stored on computer 202. The file system interpreter 213 may then analyze such returned information and pass it back to the program running on the web browser 212 in a manner that can be used by such program.

The file system interpreter 213 ultimately provides to the program running on web browser 212 a view of data in a web data store 214. The web data store 214 may include a number of Internet-based files, such as HTML files, image files, stylesheet files, and other similar files. In addition, the file system interpreter 213 may, in response to user commands, cause certain files generated by the 2-D renderer 206 to be saved in a particular folder in the web data store 214. The web data store 214 may include, in particular, a portion of a standard disk or flash storage structure on computer 202. Such storage and the operation of the programs described here may, of course, be spread across multiple computers and/or storage devices.

The file system interpreter 213 may generally be a native application running on the computer 202, so that it has access to the full range of services from the computer's operating system, including file management services and dialogues. In this manner, the file system interpreter 213 may permit the program running on the web browser 212 to access files on computer 202 where it would otherwise not be able to access them.

The system 200 may generate a variety of outputs in response to user interaction with the system 200. For example, the web browser 212 may display a variety of webpages 216a, such as dialog boxes needed for interacting with a user in capturing and saving images of a 3-D model. In addition, the webpages 216a may include a webpage for displaying and interacting with the images. The web browser 212 may also display various animations, such as interactive animations that flip from image to image, as discussed above with respect to fig one, or other such moving and interactive features for a user of a webpage.

In providing such data and interaction, the computer 202 may generate a number of files for permitting interaction with a plurality of images that simulate a three-dimensional model. For example, HTML files 218a may be generated automatically, such as files to present a webpage that shows the images to a user and allows the user to interact with the images so as to display various different images after each other in order to create an experience similar to full interaction with a 3-D model. In addition, the computer 202 may generate a plurality of image files, such as JPEG, GIF, TIFF, and other similar file format image files. The computer 202 may also generate cascading style sheet (CSS) files 218c that may additionally define the particular layout and look of web pages to be generated by the system 200. Finally, the computer 202 may generate JavaScript code 218d and may otherwise use such JavaScript code 218d. For example, such code may be used to generate dialog boxes for capturing 2-D images, and may also be used to display such images later on a webpage that permits interaction with the images by a user.

Figure 3:
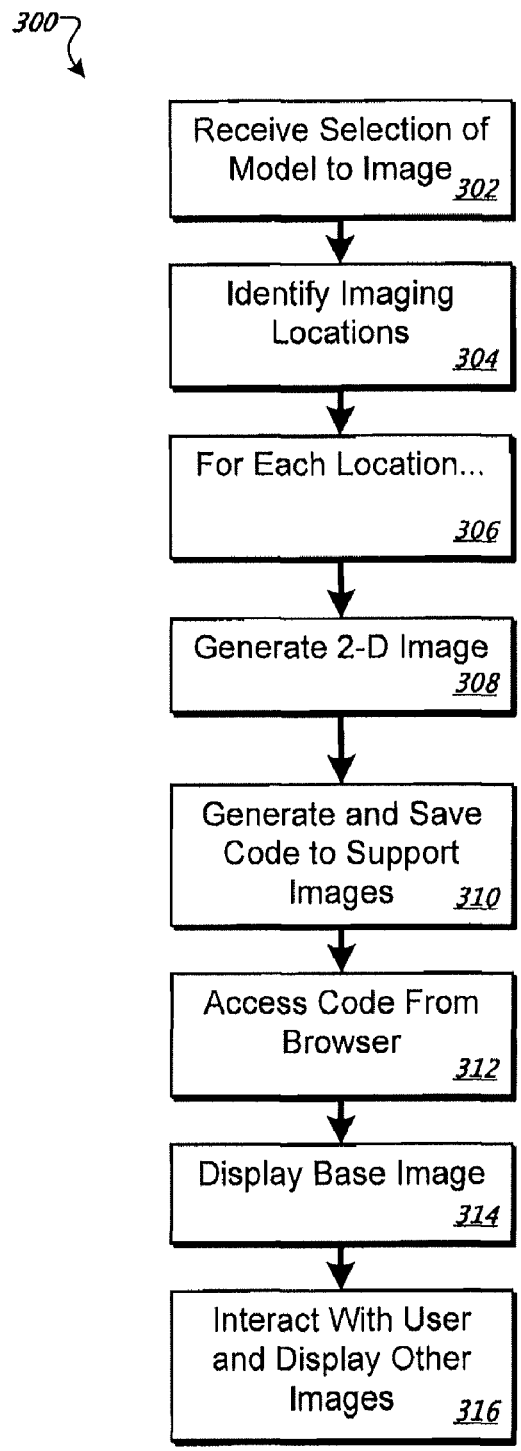
FIG. 3 is a flow chart of an example process for capturing images of a 3-D model.

FIG. 3 is a flow chart of an example process 300 for capturing images of a 3-D model. In general, the process 300 involves identifying a 3-D model, capturing a plurality of 2-D images by circumventing the model with a virtual imaging apparatus, generating code for later reviewing such images in a convenient and interactive manner, and later running such code and receiving interactions by the user.

At box 302, the process 300 first receives a selection of a model to image. For example, a user may initially open a model in a CAD program and may then select a control, such as an icon, within the program to begin a process of imaging the model. The control selected by the user may, for example, represent a plug-in provided with the CAD program for such imaging of models.

At box 304, the process 300 identifies imaging locations associated with the model. In one typical example, the locations may be at points along a circle, oval, or other geometric shape that circumscribes a path around the object. The location of each view relative to the next view may be provided by a user specifying an angle—e.g., if the user specifies ten degrees, each view will be ten degrees apart and there will be thirty-six images. Alternatively, the user may specify the number of images. The imaging locations need not be evenly spaced, however. In one example, the user may manually drag and drop the imaging locations into place, such as by starting with evenly-spaced icons of cameras that are placed automatically around the model, and then adjusting those icons. The user may generate previews of the resulting animation around the model (in a manner like that discussed below) and may then adjust the camera icons until they achieve an effect that they desire.

The particular locations for the imaging may be computed, in some circumstances, by computing the smallest X, Y, and Z point in the model, and the largest such point. A virtual sphere that contains the two points may be generated and may be considered to bound the model. A separate circle or other path may then be selected that is sufficiently far outside the sphere, given the parameters of a virtual camera provided with the program (e.g., position and field of view), that the camera, when aimed inward toward the sphere, may capture all of the sphere within its field of view.

The actual path for the camera may take on a variety of forms. In a simple example, the path may be a circle or oval with the camera at a single height relative to the model. In a more complex example, the path may be sinusoidal, and thus vary in multiple dimensions, such that as the path moves around a model, the camera also moves up and down. Such a circular and sinusoidal path may provide alternating views near the top and bottom of the model. For example, such a path may permit images of an automobile to show both the roof and the underbelly of the automobile where appropriate. In yet another example, the path that circumscribes the model may take the form of a sphere with positions for the virtual camera selected at approximately equal distances around the sphere. Using such a path, or collection of points, may enable a user to interact with the images so as to spin the model, or a least appear to spin the model, around multiple axes.

The user may also specify the size of the images to be output. Such size may be specified, for instance as a number of pixels in the X and Y dimensions. Such scaling may be particularly convenient where the images are to be incorporated into a web page, where many elements are expressed in terms of pixel dimensions.

At box 306, the process 300 begins a repeated process of locating the camera at a particular point in the circumscribing path, and generating a 2-D image, as shown at box 308. Such activity may occur automatically using a particular CAD package, as controlled through API imports from another application, such as the image generation module 204 of FIG. 2. As each image is acquired, the process 300 may perform particular functions on the image. For example, background items may be eliminated from the image, as may phantom lines or other lines such as axes from the modeling program.

Also, certain styles may be referenced for the imaging process. For example, users may set up preferring lighting scenarios for their models, such as by locating lighting sources in 3-D space and specifying the parameters (e.g., color and intensity) for the lighting sources. A user may also specify textures and materials for the model or for other items in an image.

Also, the positions along a circumscribing path may, in most circumstances, be equally spaced in a circle or oval. But other arrangements may also be used. For example, images may be analyzed from a variety of positions around a model, such as on a sphere around the model, and a degree of difference between the various images may be computed. Such degree of difference may be performed using a variety of known techniques, such as by comparing distances between common pixels in different images and the degree of change in various pixels in the images. Positions about the model may then be selected automatically so as to provide images that differ from each other in substantially equal visual amounts. For example, the imaging locations may be closer near an area of a model that contains significant detail, but may be farther apart on a less detailed portion of the model. In this manner, positions may be selected that provide a smoother experience for a user who later reviews such images, such as in a manner described below.

The images may also be taken of a real object. For example, a person wishing to list their automobile as part of an on line auction may take a plurality of digital photographs of the automobile at a common height (their eye level) at common spacing (e.g., taking two side steps between each shot) around the automobile. They may then save the images to a single folder, and applications like those discussed here may identify the image files, arrange them numerically by title (if the camera named the images sequentially), and generate the code needed to review the automobile with a 3-D effect as discussed next.

Once each computed imaging location has had an image generated for it, and the images have been saved to a determined location, the method 300 may generate and save code to support the images, at box 310. Such code may take the form, for example, of HTML and CSS code that points to the various images, for displaying the images in an appropriate progression and order. In particular, the code may generate a control for scanning forward and backward through the images, and may sequentially call up each image for display as the control is manipulated by a user. The particular code may be generated from a template into which is added data for the particular images that are to be viewed. For example, from one instantiation to the next, the names of the particular figures and the number of figures may change but other aspects of the code may remain the same. Thus, the template may be written to operate on an array of images, and the code generation process may simply add the particular file names to the array. The code may also stay as template code, and the parameters for particular images may be referenced by the code, such as by referencing data files for the imaging of the model from JavaScript code or the like.

At box 312, a second phase of the process, i.e., viewing of the images in a manner that makes them look like they are still part of a 3-D model, begins. In this example, such viewing may occur by pointing a browser to the code generated in box 310. Such an action may occur by the process 300 causing a browser to be launched and pointed at such code. Launching of the browser pointed at the code may cause the browser to execute the code, which may in turn cause the generation of controls for viewing the images of the 3-D model, and may initially display a base image, at box 314. The base image may be any of the generated images, but may typically be a first image of the model that was taken in the process 300, such as a front view of the model.

At box 316, a user interacts with the webpage that has been generated by the code with the browser, which may cause various different ones of the captured images to be displayed. For example, the user may click on the images themselves and pull left or right to indicate that they would like to have the code fetch a different image of the model. Such action may then cause the other images to be displayed in turn. If properly integrated, such activity may appear to the user to involve pulling of a three the model left and right so as to view the model from various angles, much like may occur with VRML models in a more heavyweight implementation.

Figure 4:
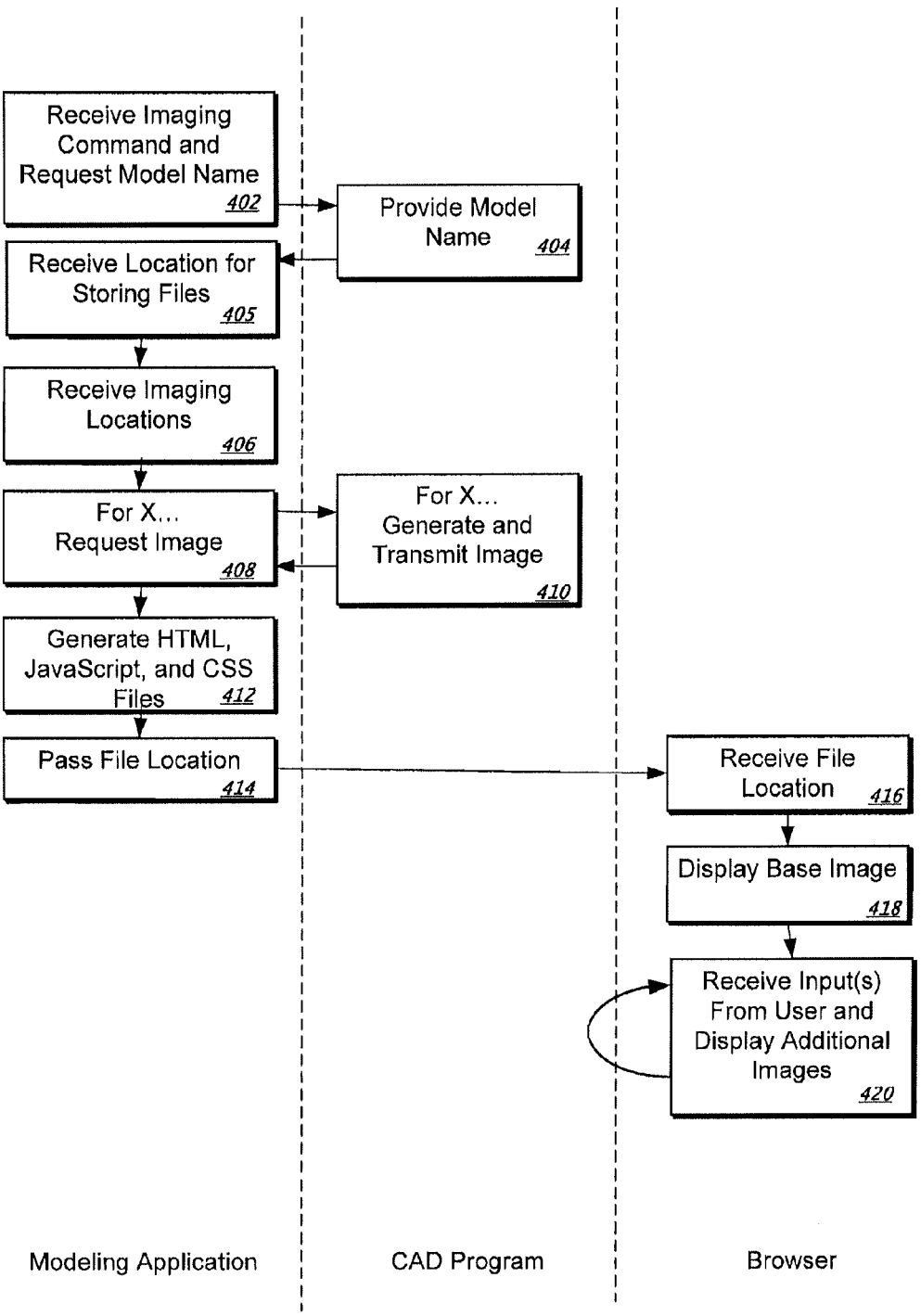
FIG. 4 is a swim lane diagram showing a process for displaying a 3-D model using a progression of 2-D images.

FIG. 4 is a swim lane diagram showing a process for displaying a 3-D model using a progression of 2-D images. In general, this process 400 is similar to the process 300 shown in FIG. 3, but indicates particular exemplary components within a system that may perform various steps in the process. In this example, the components include a modeling application, which may be a native application on a computer that is configured to cause 2-D images to be generated that are representative of a 3-D model. Another component is a CAD program, which may be a general commercial design program made to permit the generation of 3-D models, and the imaging of such models, in convenient manners. A third component is a standard web browser, which in this example need not be provided with particular plug-ins such as VRML or FLASH plug-ins.

The process begins at box 402, where the modeling application receives an imaging command and requests a model name. The CAD program may, at that time, already be displaying a model in front of the user. Such a command may come from a user selection of an icon that is presented as part of the CAD program, where the modeling application operates as a plug-in for the CAD program. At box 404, the CAD program returns a name of the model, so that the modeling application may use such a name as a default name for the collection of files, such as images, that are to be generated in association with the model. In addition, the CAD program may pass a string identifying a default folder into which files associated with the model are to be stored.

At this point, the modeling application may cause a dialog box to be displayed, such as by generating a webpage over the display of the CAD program. The dialog box may permit a user of a system to identify a location for storing files that is different from a default location, and also input parameters for camera locations in generating images of the model. For example, the user may select between a path that circumscribes the model horizontally or vertical, may select a shape for the path, and may also select a number of images to be captured along the path. Alternatively, the user may select to have images acquired from all directions pointing inward toward the model from a sphere. The modeling application may then interact with the CAD program to compute camera parameters, such as the base locations for the camera in the model space and the direction of the camera for each shot.

At boxes 408 and 410, the modeling application then steps through the location information for each imaging location and causes the CAD program to generate a 2-D image of the model from the particular location, and to save the image (e.g., as a JPEG file) to the folder or directory selected by the user. The image names may be determined by the program, such as by providing them with the model name as a prefix, and a sequential index number as a suffix, e.g., car01.jpg, car02.jpg, car03.jpg, etc.

When all of the images have been acquired, the modeling application causes various files that support the images to be generated. In particular, HTML code is generated, where the code causes the display of a webpage that fetches the individual 2-D images in progression, in response to interaction from a user, and causes the images to be presented so as to provide the impression that the actual model is being manipulated. Other such files may also be generated, such as CSS and JavaScript files. Those files may also be saved to the folder or directory selected by the user.

The user or another user may be readily directed to the figures by the modeling application sending a URL of the generated HTML code (box 414). Such transmission may occur in a variety of manners (box 416), including by redirecting a web browser to the URL so that the code is executed by the web browser, and an initial image from the images is displayed (box 418). The user may then interact with the displayed web page in a variety of manners to have the various images displayed in order to provide the effect of working with the model itself. Generally also, the images will wrap all the way around the model without a seam so that display of the model via the 2-D images does not include any substantial visual hitch, i.e., the images will be acquired from a continuous path around the model, so that a user can rotate all the way around the model without knowing where the first and last images were taken.

Figure 5:
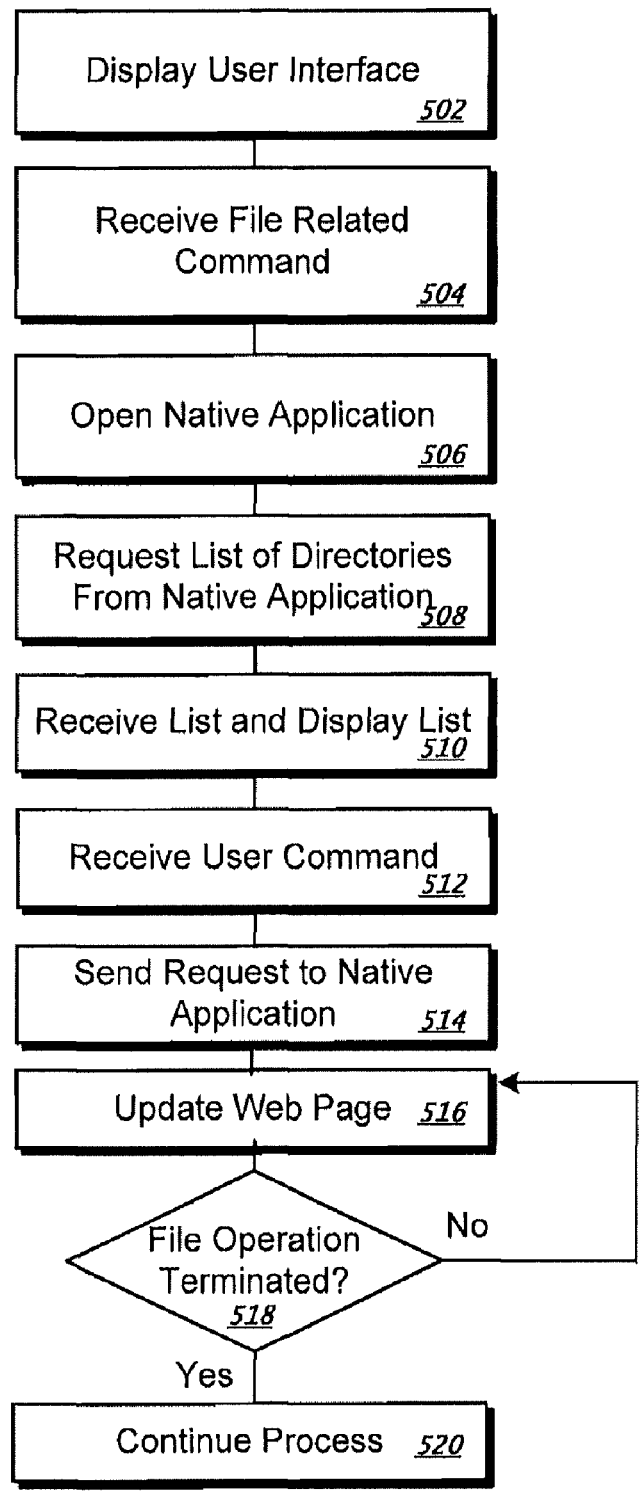
FIG. 5 is a flow chart of an example process for capturing images of a 3-D model and saving the images using a conduit application.

FIG. 5 is a flow chart of an example process 500 for capturing images of a 3-D model and saving the images using a conduit application. This process bears similarities to those described above, but focuses more on the interaction of a non-native application that does not have direct access to certain operating system services, and a native application that does have such access and that serves as a conduit to such services for the non-native application. In general, the process involves interacting with a user via a program, such as a program running on a webpage (e.g., in JavaScript), that does not have open access to a file system because of restrictions placed on the program by the application in which it is operating. The program achieves such access by communicating with a second application outside the first application, that is installed on the computer and can run independently and interact directly with the operating system, and thus may be considered a native application. Such a process may take place, for example, in receiving user input regarding a location to save certain files, by building a file manager dialog box that resembles an actual box, as described in examples above and below. For the most part, the process 500 here is described from the standpoint of the program running on the web page that generates an interface for a user.

Starting at box 502, a user interface is initially displayed. The interface may be placed over an application such as a CAD application and may permit a user to specify locations for saving images of the CAD application. The interface may include various elements for interacting with a file system on the computer on which the interface is displayed. For example, the interface may be formed as a borderless webpage that simulates the look of a file system dialog box. The dialog box may include, for example, an area for entering a file name, and a larger area showing a hierarchical folder structure for a computer storage system.

The initial display of the interface may lack particular information about the file system, as in this example, or communications with another program may initially occur to produce a starting display of file system information. For example, the identify of a default folder may be stored, and the process may access data defining the default folder so that it is initially displayed. Alternatively, a root folder for a particular storage drive may be displayed. Such display of default folders may require communication between the program generating the interface and a native application on the computer, as described below.

At box 504, a file-related command is received. For example, a user may choose to save a file, to display file or folder-related information in the dialog box, to open a file, to create a new folder in a file system, to delete a folder, or to perform other similar functions in the system. At box 506, a native application is opened. This application is separately stored on the system and may access the operating system features directly, and thus may serve as a conduit for the initial application that opened the interface, in accessing the operating system file system. The opening of the native application may occur in a variety of manners, such as by the program that generated the user interface making a call for such a native application.

At box 508, a request is made for a list of directories from the native application. For example, the program that generated the interface may need to display a number of directories in response to a request from a user. That program may thus identify directory-related information and pass it in a determined manner, such as by an application programming interface (API), to the native application. The native application may in turn be programmed to receive, recognize, and interpret such requests. For example, the native application may parse a message received from the program that generated the interface, and create its own request formatted in an appropriate manner for a file system associated with an operating system on the computer. The request from the program that generated the user interface may be an asynchronous request, such as a request using AJAX methods, so that such program may continue operating while waiting for information to return from the native application.

At box 510, the program receives a list of directories or folders from the native application and displays the list. The list of directories may have been created by the native application by formatting a request to a file managing component of an operating system and receiving a response to that request. The native application may then have extracted information from the response and reformatted that information for transmission to the program that generated the user interface. For example, the native application may send a list of strings formatted in a particular manner, where the strings represent folder names or subdirectory names in a particular directory.

Upon receiving such names from the native application, the program may display a list of such folders. To do so, the program may access image files that show icons representative of folders in an operating system, and may display those icons in a list with the textual information about the folders received from the native application. Such display may occur in a box on the user interface that corresponds to a typical folder or directory display area in a file manager interface. As a result, the user may be presented with a display that makes it look like the original program is actually accessing file management features of the operating system directly, rather than indirectly. Such an example display is shown in FIG. 8B.

At box 512, a user command is received. For example, the user command may be a click by the user on a particular folder icon in the displayed list, indicating that the user would like to see the subfolders underneath the selected folder. The program generating the interface may interpret such a selection, and provide data to the native application according to the API, to indicate that the native application should gather from the operating system a list of subfolders (box 514).

The native application may thus in turn send to the operating system a request for a subfolders list or other data indicating the identity of the sub-folders. Such a request may occur while the program that generated the interface continues with other operations while waiting for a response (i.e., asynchronous operation). As in the interaction described above, the native application may receive information from the operating system, may reformat the information appropriately, and may pass the new information to the program that generated the interface. That program may then update the strings and folder icons shown in the display so as to make it look to the user like they actually drilled down in the directory structure (box 516). Such updating may occur, for example, by editing a DOM tree associated with the display in a familiar manner.

Until the file operation is terminated (box 518), the process 500 continues to wait for and accept user commands with respect to the file system. Once the file operation is terminated, the process continues (box 520) such as by saving or opening a file selected by the user.

The file access process may take on, in one example, four different states. In a first state, the target directory is unselected and closed. Clicking on it selects it (e.g., by highlighting it and updating its title bar) and opens it. JavaScript code or other such code then makes a call to a native application, such as a Ruby application, for the sub-directories, and the native application reports back in an asynchronous manner the children or an error (e.g., the directory was not found). The JavaScript then modifies the HTML DOM to show the directory as selected, the icon for the directory as an open folder, and the subdirectories slightly indented from the directory, with closed icons. The selected directory label may also be changed in response to the selection.

In a second state, the target directory was unselected and open (rather than closed). Clicking on the directory highlights the directory in the interface and updates the label that indicates which directory is selected.

In a third state, the target directory was selected and closed. Clicking on the directory causes the JavaScript to issue a request to the native application for the sub-directories, and the JavaScript receives the results in an asynchronous fashion and presents the sub-directories as sub-nodes of the directory (slightly indented and with closed folder icons). The JavaScript also swaps in an open folder icon for the selected directory.

In a fourth state, the target directory was selected and open. Clicking on the directory causes the JavaScript to edit the DOM to show the directory as closed (but still selected) and hides the sub-directories. If the user clicks on an "OK" button in the dialog, the selected directory is passed to the calling application and the dialog closes.

In other situations, the user may select a control to create a new directory, much like they would in a normal file management dialog. Such a selection will bring up another dialog box, which will shadow out the original dialog box. The user can enter a new directory name for the subdirectory, which name the JavaScript will pass to the native application, which will in turn cause that sub-directory to be created and pass an indicator of success of the operation back to the program in an asynchronous fashion. The JavaScript may respond to the message of success by adding a new sub-directory indicator to the DOM, and by opening it as the selected sub-directory.

Figure 6:
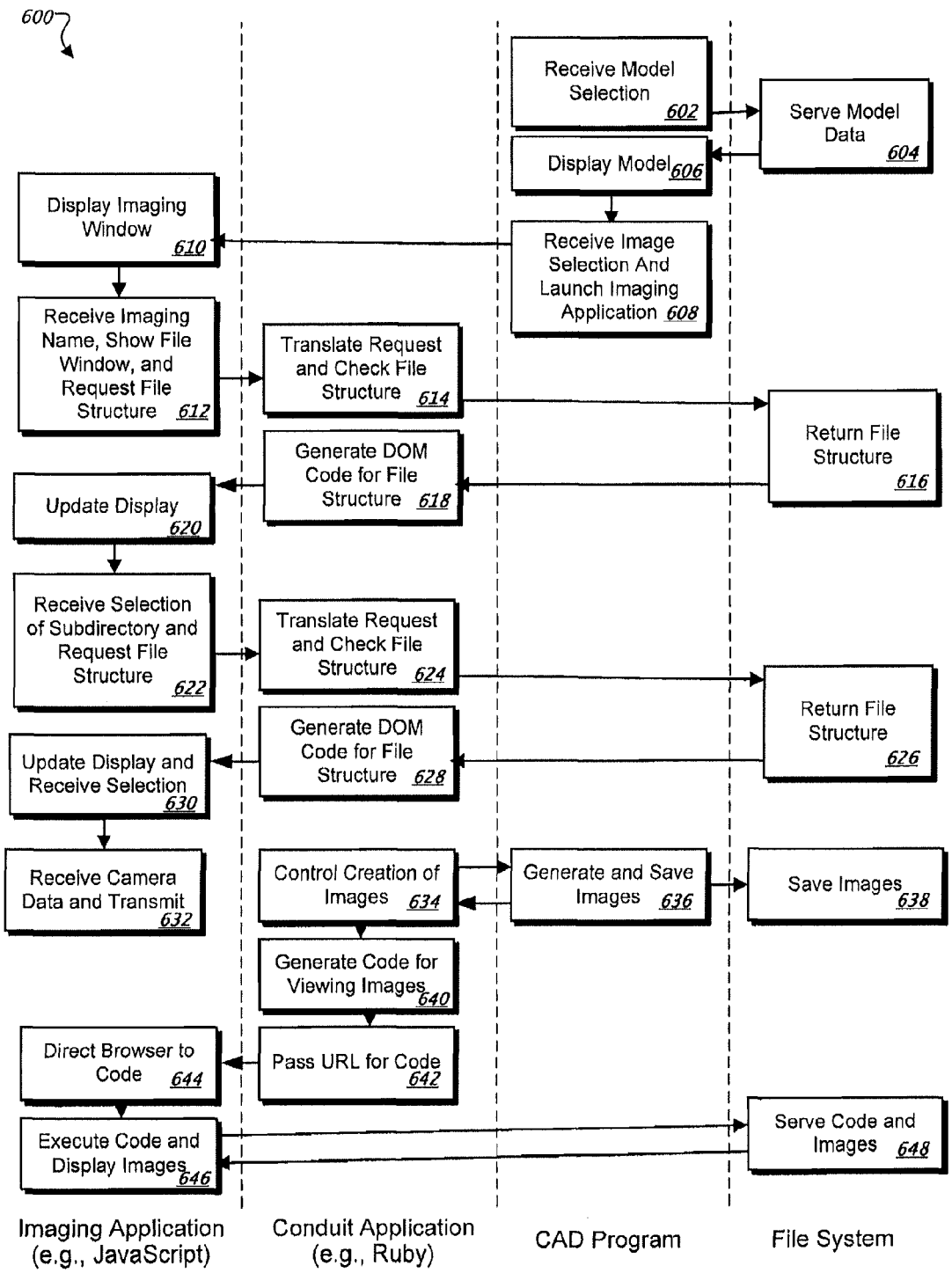
FIG. 6 is a swim lane diagram showing a process for generating and displaying a 3-D model using a progression of 2-D images with the help of a conduit application.

FIG. 6 is a swim lane diagram showing a process 600 for generating and displaying a 3-D model using a progression of 2-D images with the help of a conduit application. In general, the process 600 is similar to the process 500 in FIG. 5, but shows other operations and additional detail, in addition to showing particular components that, in this example, may be used to perform certain actions in the process. These components include an imaging application that is responsible for interacting with the user in capturing images from a CAD program, where in this example, the imaging application is written at least in part using JavaScript. The components also include a file system that the other components access to obtain stored information and save additional information. Finally the components include a conduit application, written here in Ruby, that is an application separate from whatever application the imaging application is running in, and that communicates directly with operating system components so as to be able to serve as a conduit for the imaging application.

At box 602, the model selection is initially received in a CAD program. Such a selection may take a familiar form, such as by a user selecting a data file "open" icon and selecting a file from a list of multiple files. The selection may also occur in the manner known for the GOOGLE SKETCHUP 3-D warehouse. The file system responds by serving model data to the CAD program (604), and the CAD program displays the model, at box 606, in a typical manner.

The CAD program may be provided with a plug-in program that corresponds to the imaging application, and an icon for the program may be shown on the display of the CAD program. Selection of the icon by a user may launch the imaging application, which may be programmed to capture a plurality of sequential images of the model in the CAD program and save the images and generated markup code in a manner that a webpage may display the images to evoke an impression that the viewer is actually manipulating the model, and not just a series of images.

Upon receiving an imaging selection, the CAD program may cause the imaging application to be launched (box 608). Upon opening, at box 610, the imaging application may display an imaging window. The window may be, for example, a borderless browser window that is formatted to resemble a file access dialog box (see, e.g., FIG. 8A). The dialog box may initially show several default values such as a name to be associated with the images that matches a name of the model obtained from the CAD program, a number of images to obtain of the model, and a location for saving image-based files. At box 612, the process receives various inputs for such values, and also receives a request from a user to see the file structure on the computer system on which the imaging application and conduit application are running, and on which the file system is operating. The imaging application, in response to the user requests, sends a request to the conduit application, which the user may have previously installed on the computer for the purpose of allowing the imaging application to indirectly interact with the file system.

Upon receiving the request, the conduit application translates the request and sends the corresponding request to the file system to check a file structure (box 614), such as to obtain a list of file folders in a root directory for the file system. At box 616, the file system returns the file structure in a familiar format for the particular operating system, to the conduit application. The conduit application then, at box 616, generates code for modifying the DOM to reflect an update in the interface that shows the file structure obtained from the file system. At box 620, the imaging application updates the display. Alternatively, the imaging application, rather than the conduit application, may generate the appropriate code for modifying the DOM.

A user may then be presented with a dialog box that shows a number of subdirectories that may be selected, and at box 622, the user selects a subdirectory and thus requests to see the file structure within that subdirectory. Again, the imaging application sends a request to the conduit application, the conduit application translates the request and checks the file structure from the file system (box 624), the file system returns the file structure (box 626), and the conduit application (alone or in cooperation with the imaging application) again generates code for modifying the DOM structure of the display so as to reflect the change in the directories, e.g., to switch an icon of a selected directory from a closed image to an open image, and to add a list of sub-directories (with closed folder images) indented from the main directory (box 628).

The user may then, by clicking on a particular control, select the particular directory for saving files, thus causing the path for the folder to be saved and the file dialog box to disappear. After the display has been updated in this manner, the user may provide a selection on the next display, which may be another dialog box by which the user may establish certain parameters for imaging of a model (box 630). At box 632, for example, the user may provide information about a camera to view the model, such as a number of images for the camera to create. The imaging application may pass such data to the conduit application, in certain implementations, which may then control creation of images by the CAD program (box 634) by interacting back-and-forth with the CAD program to control the positioning of the camera relative to the model (box 636). Upon acquiring each image, the CAD program may save the images in the file system (box 638), and may obtain information about the subdirectory in which to save the files from the conduit application.

Once the conduit application and the CAD program have stepped through the imaging process and saved all necessary images, the conduit application may generate code to allow a user to view the images in a convenient manner. At box 640, for example, the conduit application generates HTML code for a webpage to display the images in a seamless manner as the user manipulates the images so as to create the impression of rotating the model in space. As noted above, the code may be generated from a template, where the template defines certain control elements and display elements, and particular values, such as the number of images and the names of the image files, may be added during creation of the code.

After creating the necessary code and placing it in a particular location, the conduit application may then pass a URL for the code to the imaging application (box 642) or to another appropriate browser-based application or other application. At box 644, the URL causes the browser to be directed to the code, to load the code, to execute the code, and to thereby generate a visual display for the user of one of the images along with controls for manipulating the image. At box 646 the user chooses to rotate the image so as to be able to see various sides of the model represented by the images, and such images are fetched from the file system (box 648).

Figure 7:
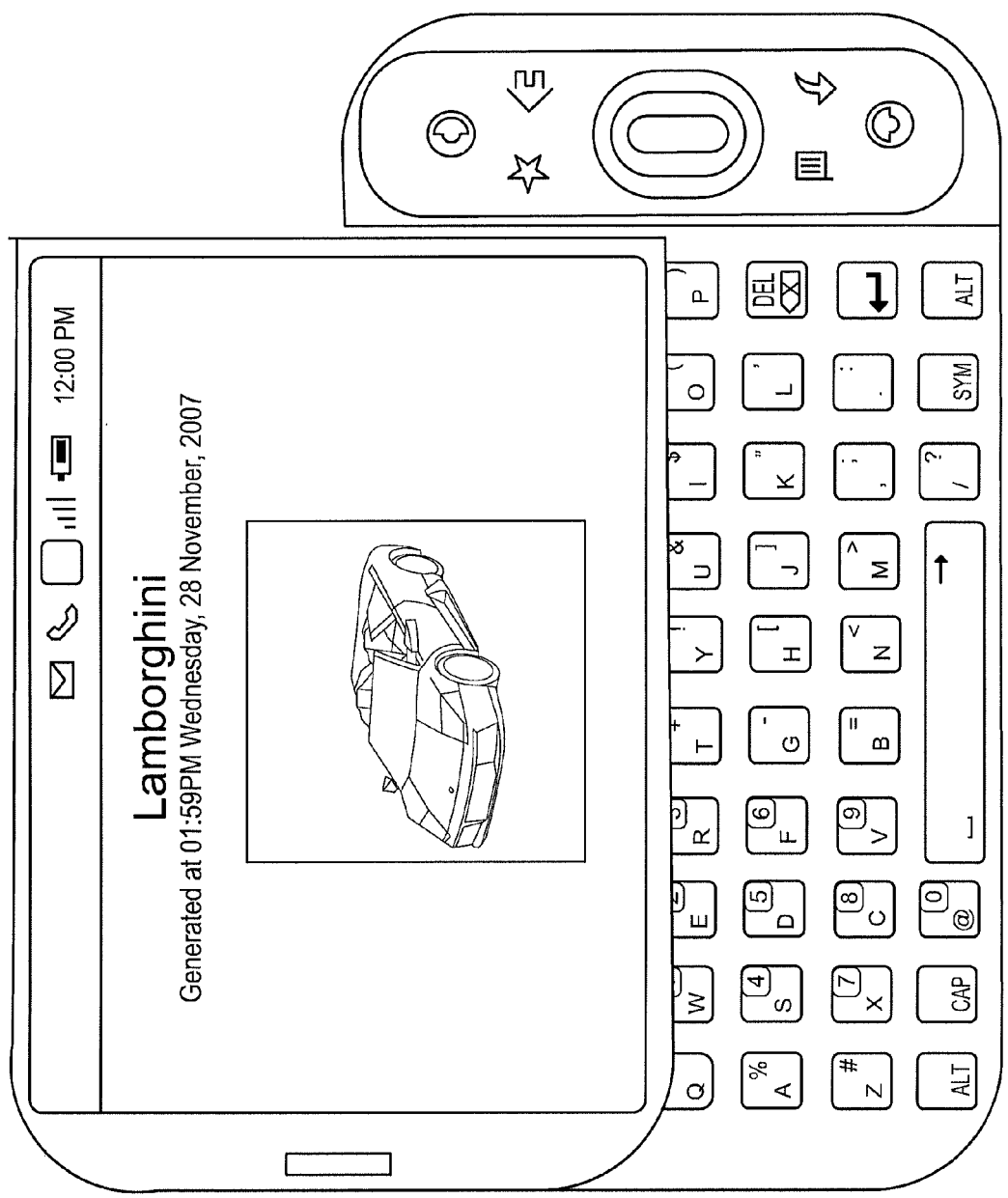
FIG. 7 shows a mobile device displaying a 3-D model using 2-D images.

FIG. 7 shows a mobile device displaying a 3-D model using 2-D images. In this example, the mobile device is intended to represent a device that has not had particular three-dimensional imaging plug-ins added to it or other generic 3-D imaging provided for it. Alternatively, the device may have such capabilities but may be displaying a webpage whose author was not confident that many consumers would have such capabilities, and thus did not code such capabilities into the page. Shown on the display 710 of device 700 is an image of a 3-D model of an automobile from a particular angle. The device 700 may have a touchscreen, and the HTML code for generating the display 710 may respond to lateral dragging motions across the touchscreen in the area of the display 720, by fetching progressive adjacent images that were generated from the model of the automobile. Scanning through the images may also be controlled by a trackball located at the middle-right of the device. In this manner, the display 710 may provide a user with interactivity that is otherwise generally provided by more complex and involves systems such as flash animation systems.

FIGS. 8A-8F show screen shots of a process for capturing and using 2-D images of a 3-D model. In general, the figures show, in one particular example, a user initially capturing images of a model, and then manipulating those images to achieve a 3-D-like experience using 2-D images.

Figure 8A:
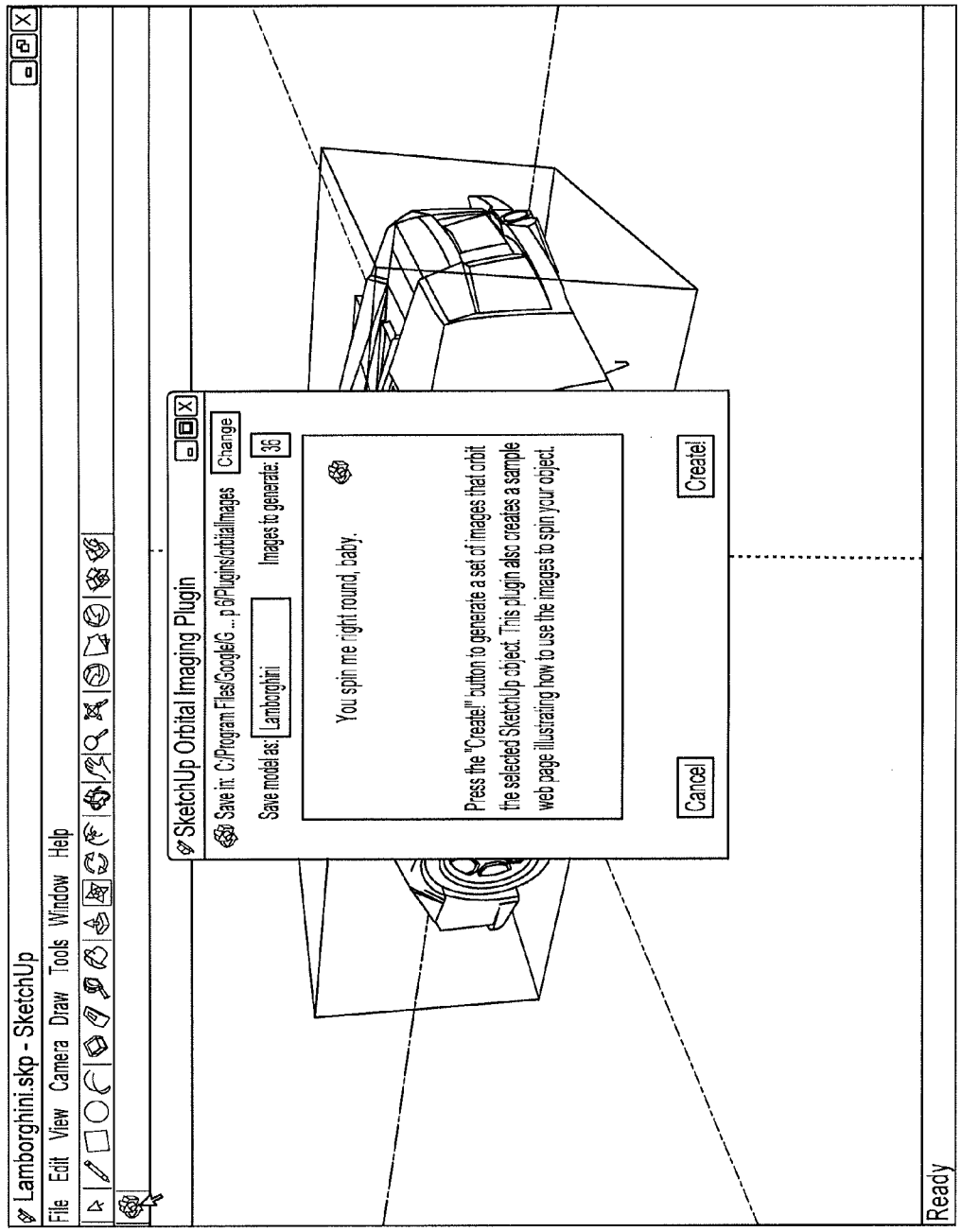
FIGS. 8A-8F show screen shots of a process for capturing and using 2-D images of a 3-D model.
Figure 8B:
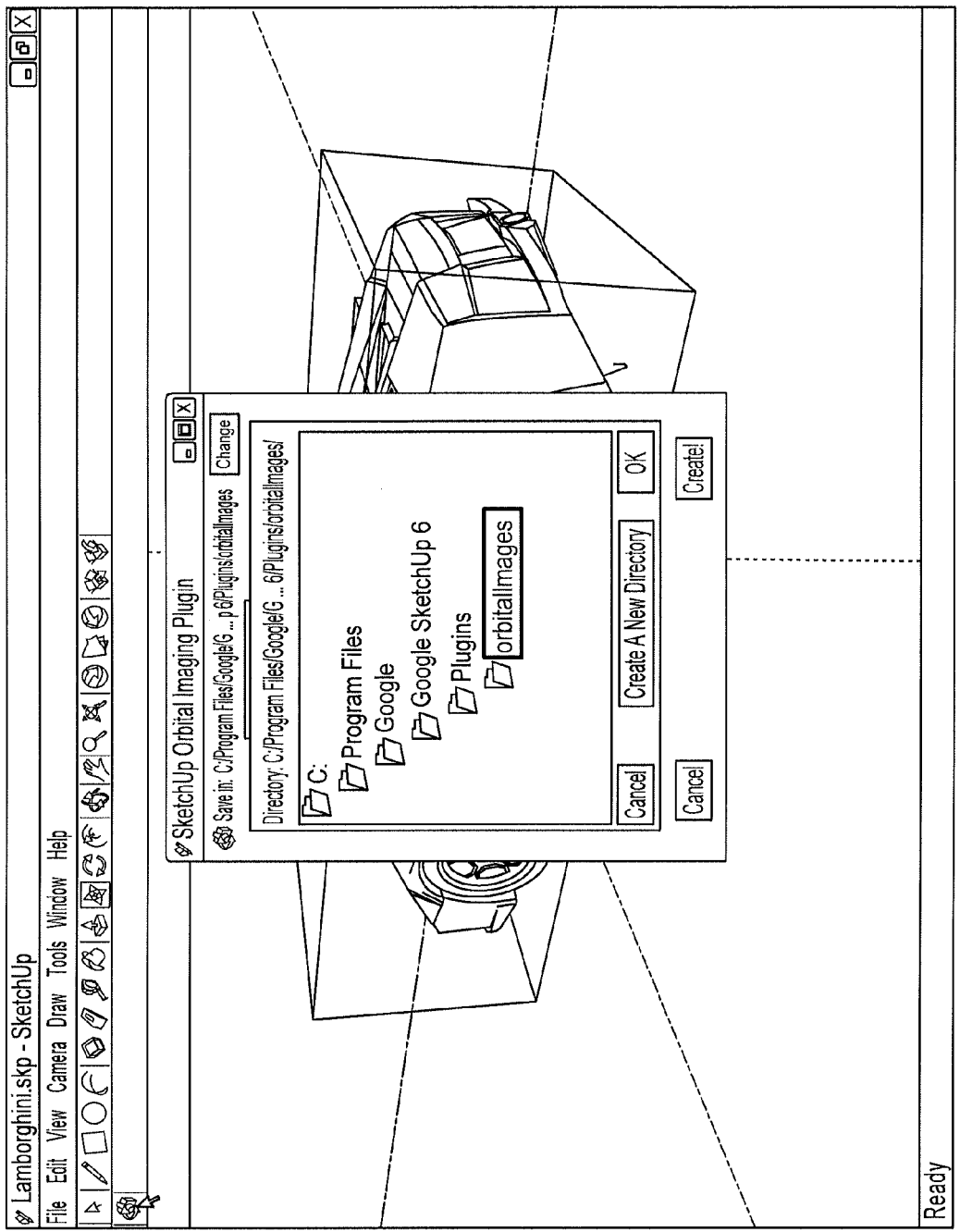

FIG. 8A shows a display 800 of a design or CAD application 802—here, the GOOGLE SKETCHUP application—with an imaging dialog 804 overlaid on the application. The program for generating the overlay has been invoked by a plug-in for the application, where the plug-in generates an user-selectable icon 806. Here, the user has just selected the icon, causing the dialog 804 to be generated over the application. In this particular example, the dialog is generated as a borderless web page that has display content formatted to look like a dialog box that would be generated by a typical application.

The dialog box 804 presents the user with instructions and the ability to enter three different parameters for the imaging process. First, a default name for the imaging is automatically entered in a name box 808, and the user can change that name. The name selected by the user may affect the name that is given to image files and to information that is later displayed on an automatically generated web page for displaying the images. An imaging parameter input box 812 allows the user, in this example, to select a number of images to be taken of the model. A higher number of images will permit for smoother manipulation of the object in the future, but will take up more space for storing the additional images. Here, thirty-six images are to be generated, at ten degree intervals around the model.

In other interfaces, a user may be provided with alternative or additional imaging choices. For example, the user may be allowed to select an axis around which the virtual camera will rotate in creating images of the model. The user may also identify a path or path shape (e.g., circle, oval, etc.) for the camera. For example, if the user selects an oval path, the model will appear to move toward the user and away from the user when they manipulate the images of the model to rotate the model in space. Also, the user may be given an option to acquire images from points on a sphere or other 3-D object around the model.

Example JavaScript code for generating the dialog shown in FIG. 8A is attached hereto in Appendix D. Common functions accessed by that code are attached hereto in Appendix E.

FIG. 8B shows the application 802 of FIG. 8A with a file manager 814 generated in a light box over the dialog box 804. The file manager shows a default directory path and provides a number of controls that let a user select a displayed directory or subdirectory, to create a new directory, to cancel the operation, or to confirm the operation (with the "OK" button) and thus set the currently-selected directory as the directory into which files will be saved. The display of FIG. 8B may be called up by a user selecting the "Change" button in FIG. 8A.

Example JavaScript code for generating the dialog shown in FIG. 8B is attached hereto in Appendices A and G. Example CSS code for the dialog is attached in Appendices B and H. Example HTML code (for generating images of a model of a house) is attached in Appendix I.

Figure 8C:
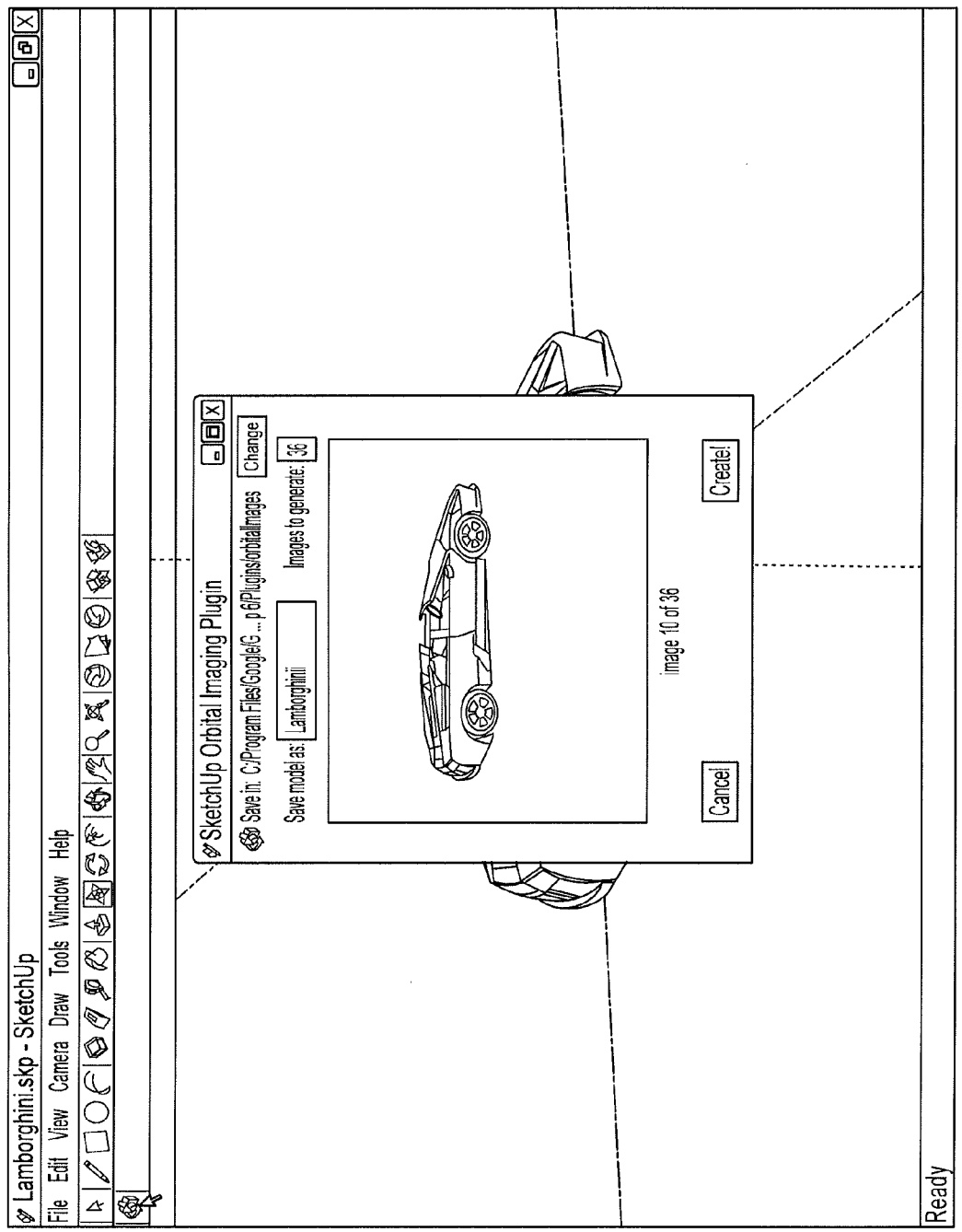

FIG. 8C shows the dialog box 804 after a user has selected a folder into which files are to be saved and has also selected a number of images to capture of the model. In this figure, the tenth of thirty-six figures is in the process of being captured. The dialog 804 may show each image as it is captured and saved. When the captures are complete, a message to that effect may be shown to the viewer. Example JavaScript code for causing the images to be captured is attached hereto in Appendix D.

Figure 8D:
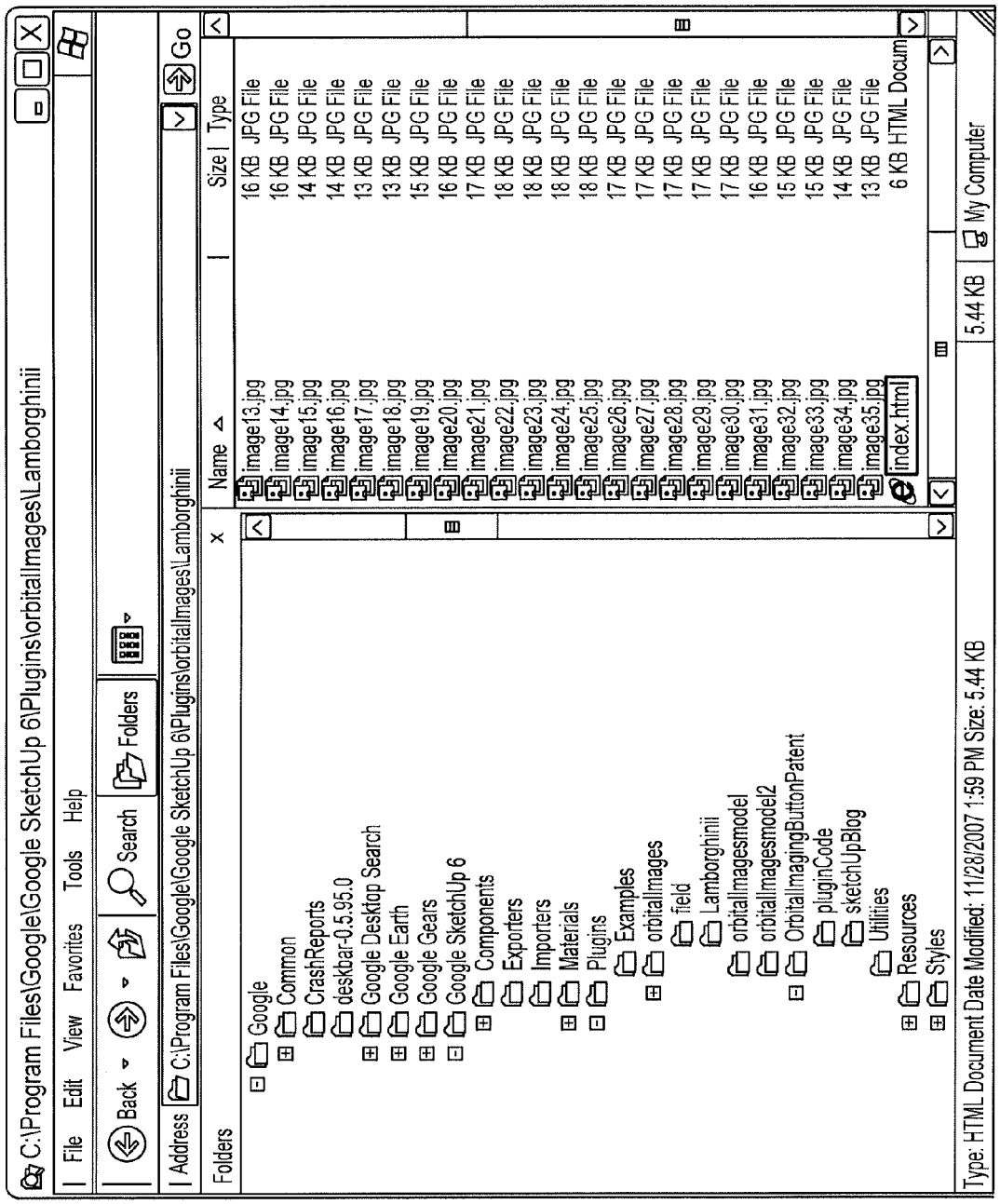

FIG. 8D is simply a file manager view of the files that were saved by the process depicted in FIG. 8C. As shown, the files were stored in the c:\program files\Google\Google SketchUp 6\Plugins\orbitalimages \Lamborghini sub-directory. The files include thirty-six image files of the car model (labeled "image00.jpg" to "image.35.jpg"), and an HTML file named "index.html." The content of the HTML file is discussed next.

Figure 8E:
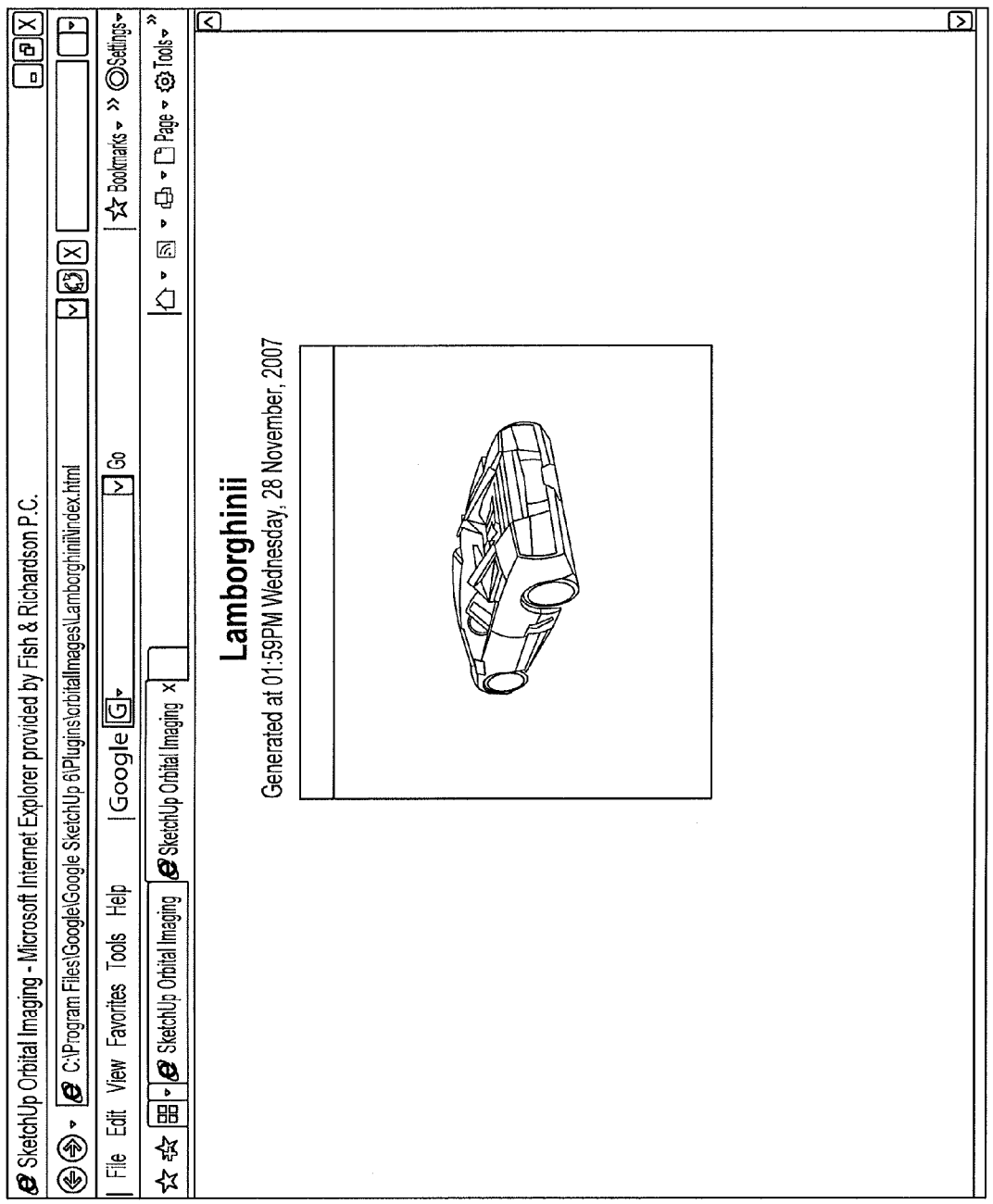
Figure 8F:
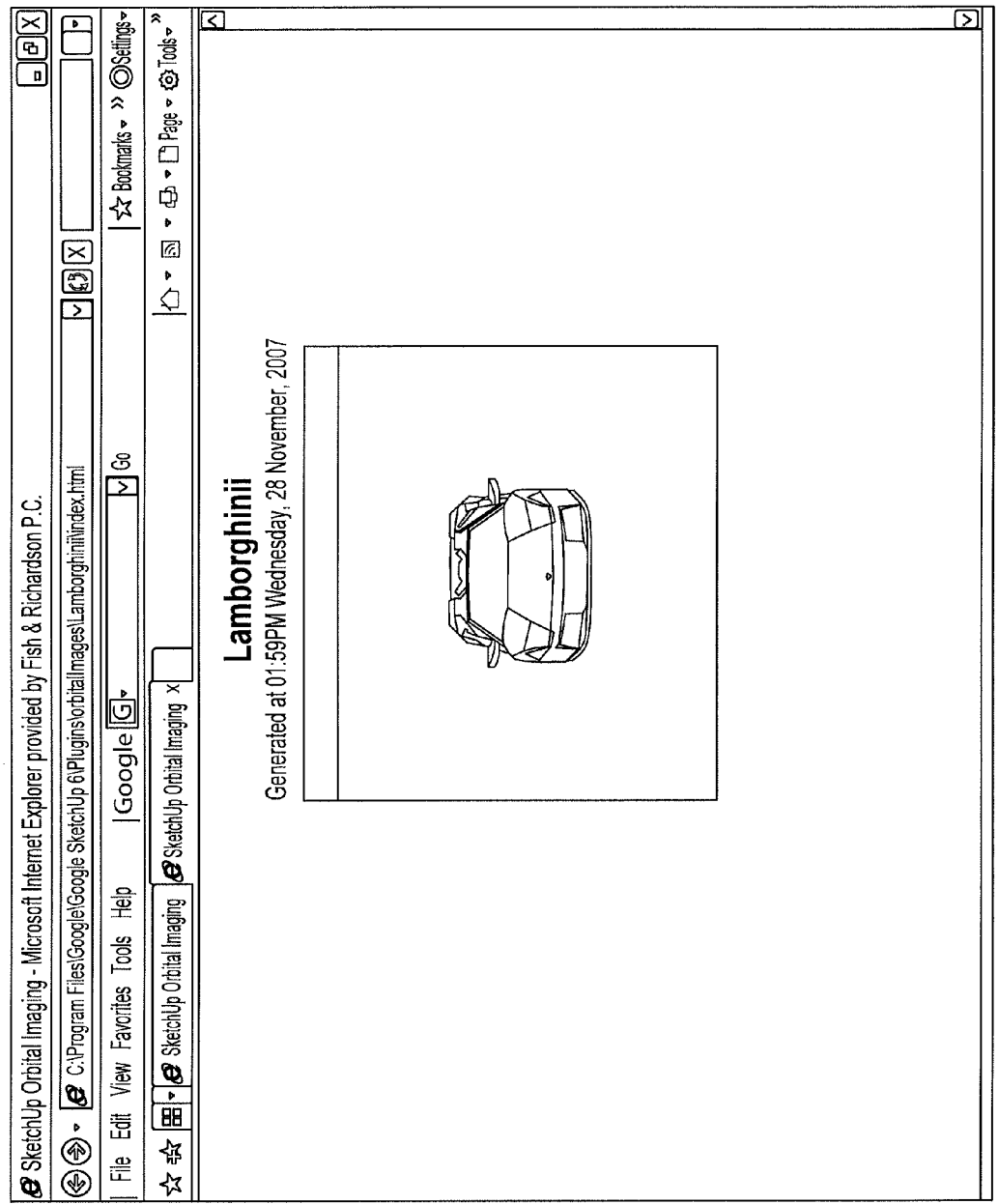

FIGS. 8E and 8F show displays of the web page created by the process just discussed, where each figure shows one of the images that has been captured. A control in the form of a two-headed arrow can also be seen near on top of each image. That control appears when a user hovers their pointer over the images. If the user then down clicks and drags left or right, such action will cause the model to appear to rotate counter-clockwise or clockwise, i.e., by fetching various of the saved figures of the model.

HTML template code for generating the dialog is attached in hereto in Appendix F. The HTML code for displaying FIGS. 8E and 8F (which may be formed from the template code) may take, in one example, the following form:

```
<HTML>
    <HEAD>
        <TITLE>SketchUp Orbital Imaging</TITLE>
        <STYLE>
#title {text-align: center; font: bold 1.4em arial; margin-bottom: 3em;}
            #date {margin-top: 3px; font: normal 0.5em arial;}
#sketchUpObj {text-align: center; width: 400px; z-index: 2; border: solid 1px #676767;}
#sheet {position: absolute; z-index: 3; background-color: #FF00FF; cursor: w-resize;}
        </STYLE>
        <SCRIPT>
        // list of image filenames
var imageFileNameArray = new Array('image0.jpg', 'image1.jpg', 'image2.jpg',
'image3.jpg', 'image4.jpg', 'image5.jpg', 'image6.jpg', 'image7.jpg', 'image8.jpg',
'image9.jpg', 'image10.jpg', 'image11.jpg', 'image12.jpg', 'image13.jpg', 'image14.jpg',
'image15.jpg', 'image16.jpg', 'image17.jpg', 'image18.jpg', 'image19.jpg', 'image20.jpg',
'image21.jpg', 'image22.jpg', 'image23.jpg', 'image24.jpg', 'image25.jpg', 'image26.jpg',
'image27.jpg', 'image28.jpg', 'image29.jpg', 'image30.jpg', 'image31.jpg', 'image32.jpg',
'image33.jpg', 'image34.jpg', 'image35.jpg', 'image35.jpg');
        // list of html image elements
var sketchUpImageArray = new Array( ); var currentPos = 0; var addToPos = 0; var
imageCount = 0; var sketchUpObj = null; var mouseXOrig; var mouseX = 0; var mouseY
= 0; var mouseIsDown = false; var title = null;
            function init( ) {
                title = document.getElementById('title');
                sketchUpObj = document.getElementById('sketchUpObj');
                imageCount = imageFileNameArray.length;
        // load up the imageArray with the sketchUp images
            for (i = 0; i < imageCount; i++) {
                sketchUpImageArray[i] = new Image( );
                sketchUpImageArray[i].src = imageFileNameArray[i];
                sketchUpImageArray[i].className = 'sketchUpImage';
                hide(sketchUpImageArray[i]);
                sketchUpObj.appendChild(sketchUpImageArray[i]);
                }
        // create a transparent sheet over the images so that the mouse
        // events go it
            var sheet = document.createElement("DIV");
            document.body.appendChild(sheet);
            sheet.id = "sheet";
            sheet.style.left = sketchUpObj.offsetLeft + "px";
            sheet.style.top = sketchUpObj.offsetTop + "px";
            sheet.style.width = sketchUpObj.offsetWidth + "px";
            sheet.style.height = sketchUpImageArray[0].height + "px";
            sheet.onmousemove = handleRotate;
            sheet.onmousedown = handleMouseDown;
            sheet.onmouseup = handleMouseUp;
            sheet.onmouseout = handleMouseUp;
            setOpacity(sheet, 0.0);
            show(sketchUpImageArray[0]);
            }
            /**
            * When the mouse goes down, start rotating the image
            *
            * @param {Event} mousedown event
            */
            function handleMouseDown(e) {
                if (!e) { e = window.event; }
                getMouseXY(e);
                mouseXOrig = mouseX;
                addToPos = 0;
                mouseIsDown = true;
                }
            /**
            * When the mouse goes up, stop rotating the image
            *
            * @param {Event} mouseup event
            */
```

```
            function handleMouseUp(e) {
                mouseIsDown = false;
                currentPos += addToPos;
            }
        /**
         * Divide the width of the html object by the number of images.
         * As the mouse moves over the html object, show the appropriate image
         * giving the illusion that the user is spinning the object.
         *
         * @param {Event} mousemove event
         */
            function handleRotate(e) {
                if (!e) { e = window.event; }
                if (!mouseIsDown) {
                   return;
                }
                getMouseXY(e);
        // STEP is how many pixels equals an image swap
                var STEP = 10;
                var width = sketchUpObj.offsetWidth;
                var delta = mouseX − mouseXOrig;
                addToPos = Math.floor(delta/STEP);
        // title.innerHTML = mouseX;
        //handle wrap around
                var wrap = (currentPos + addToPos) % imageCount;
                var newPos = (wrap < 0) ? imageCount + wrap : Math.abs(wrap);
        //hide everyone except the image we are over
                for (var i = 0; i < imageCount; i++) {
                    hide(sketchUpImageArray[i]);
                }
                show(sketchUpImageArray[newPos]);
                return false;
            }
        /**
         * Get the mouse position from the event e
         * @param {Event} e mouse move event
         */
            function getMouseXY(e) {
                   if (e.pageX) {
                        mouseX = e.pageX;
                        mouseY = e.pageY;
                   } else {
    mouseX = event.clientX + document.body.scrollLeft;
    mouseY = event.clientY + document.body.scrollTop;
                   }
                        if (mouseX < 0){mouseX = 0;}
                        if (mouseY < 0){mouseY = 0;}
            }
            /**
             * Get the left coordinate of the element
             */
            function getLeft(element) {
                var x = 0;
                while (element) {
                    x += element.offsetLeft;
                    element = element.offsetParent;
                }
                return x;
            };
            function setOpacity(element, opacity) {
element.style.filter = "alpha(opacity=" + Math.round(opacity*100) + ")";
                element.style.opacity = opacity;
            }
            /**
             * Hides the HTML element.
             * @param element HTMLElement the element we hide
             */
            function hide(element) {
                element.style.display = 'none';
            }
            /**
             * show the HTML element.
             * @param element HTMLElement the element we want to see.
             */
            function show(element) {
                element.style.display = 'block';
            }
            </SCRIPT>
            </HEAD>
```

```
<BODY onload=init( )>
    <DIV id='title'> Lamborghinii<DIV id=date>Generated at 01:59PM
Wednesday, 28 November, 2007</DIV> </DIV>
        <CENTER><DIV id='sketchUpObj'></DIV></CENTER>
    </BODY>
    </HTML>
```

Other various techniques for allowing a user to interact with and display various ones of the saved images may also be employed.

Figure 8G:
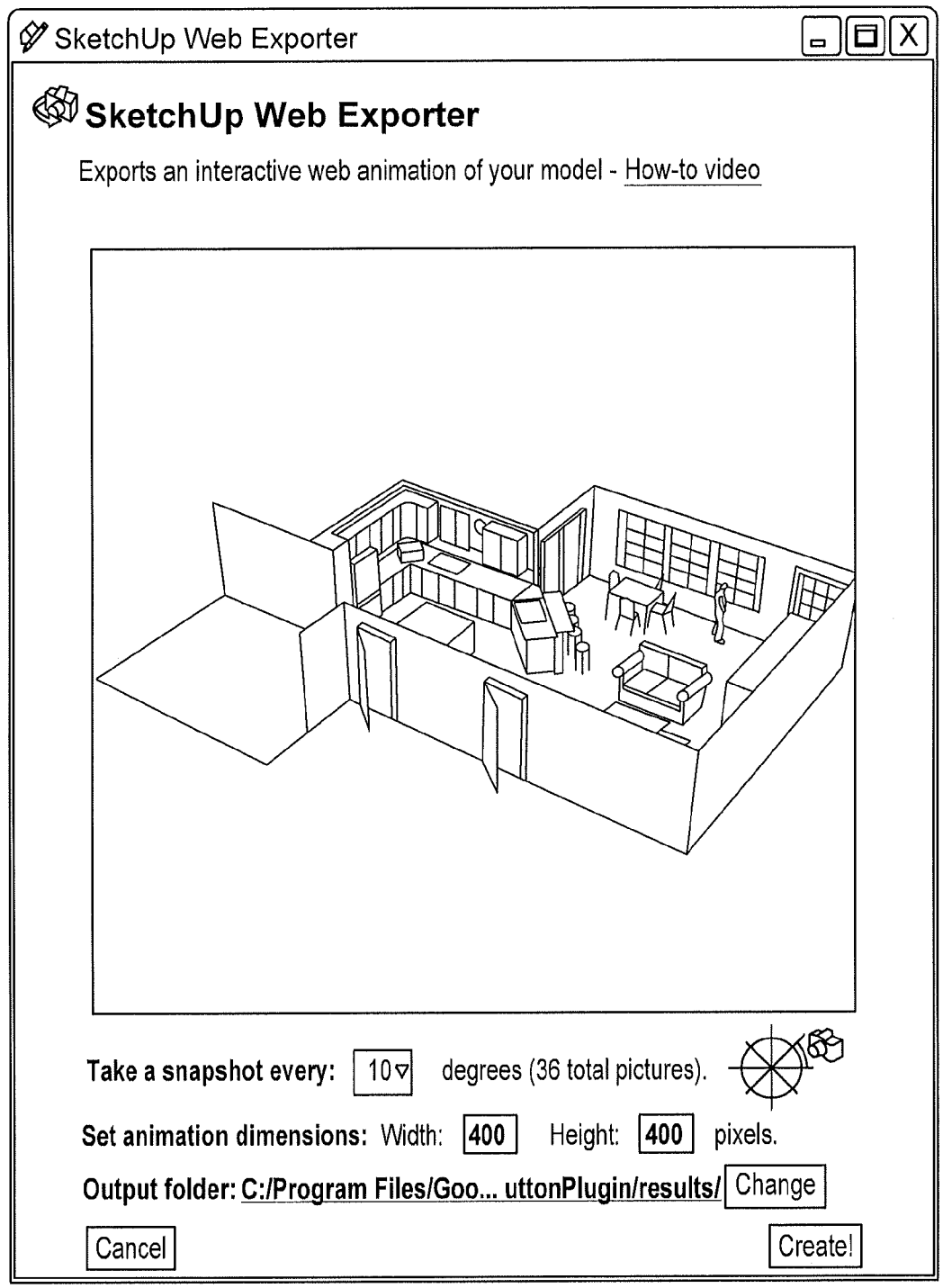
FIGS. 8G-8J show screen shots of dialog boxes for managing image capture of a model.

FIGS. 8G-8J show screen shots of dialog boxes for managing image capture of a model. These screenshots are similar to those just discussed, but show alternative mechanisms for interacting with a user of such a system. FIG. 8G shows a dialog box like that shown in FIG. 8A. In particular, the dialog box shows an example first image of a model being imaged, and permits a user to enter three parameters associated with such imaging. The first parameter is the number of degrees between each image in a circle around the model being images. The second is the size of the images to be generated, in terms of pixels in the X and Y directions. The third is a folder in which the images and other associated files are to be placed, with a button control that the user can select to change the folder. For example, the system may initially show a default folder such as the common mydocuments folder for MICROSOFT WINDOWS computers, and the user may change to a different folder.

Figure 8H:
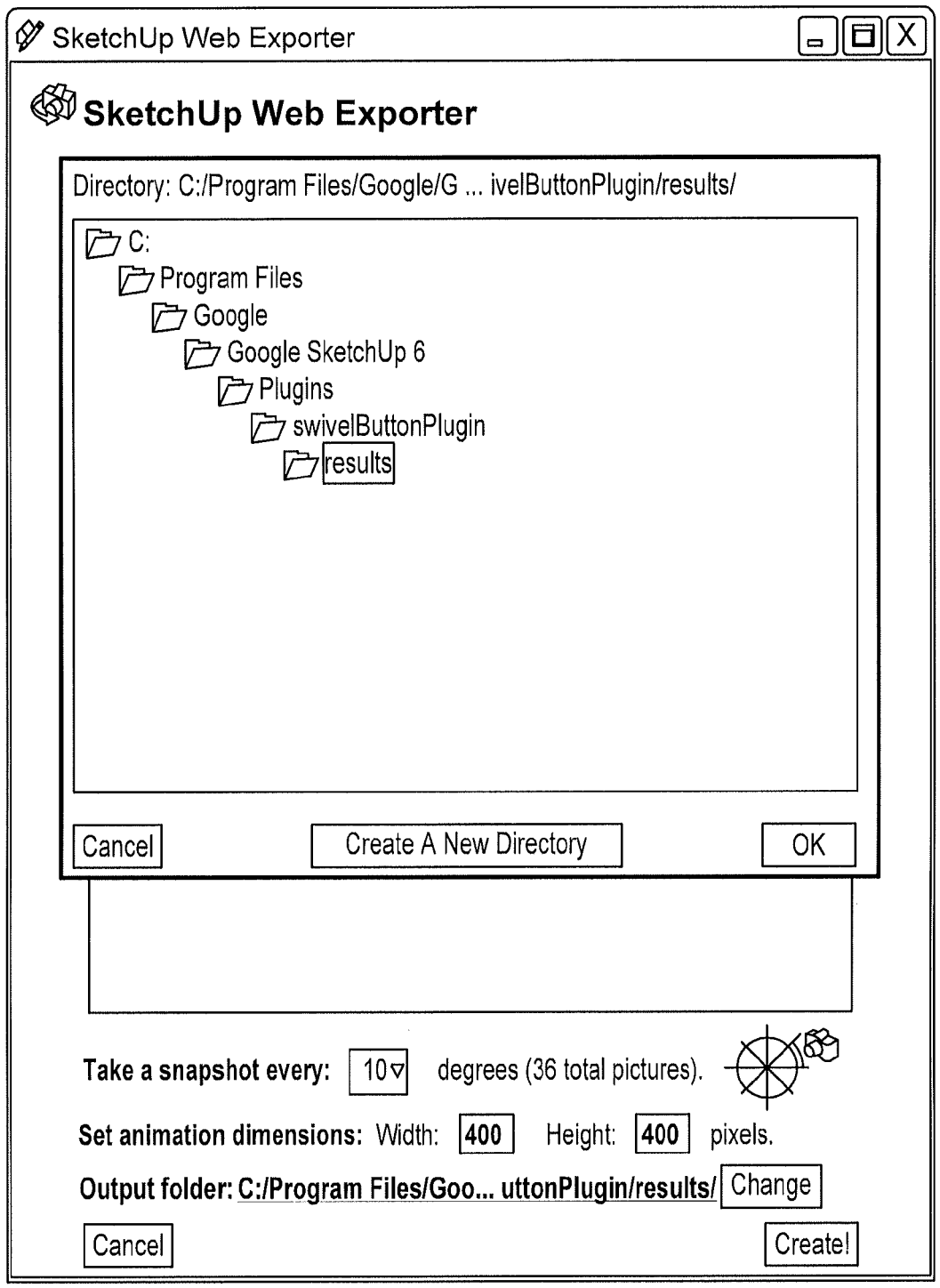

FIG. 8H shows a dialog box by which a user is navigating a folder structure on an computer, and is this similar to FIG. 8B. The dialog box may be generated, as discussed above, in a web browser window made to look like a file manager dialog box, where the code generating the browser window communicates with a conduit application that gives it access to file system information.

Figure 8I:
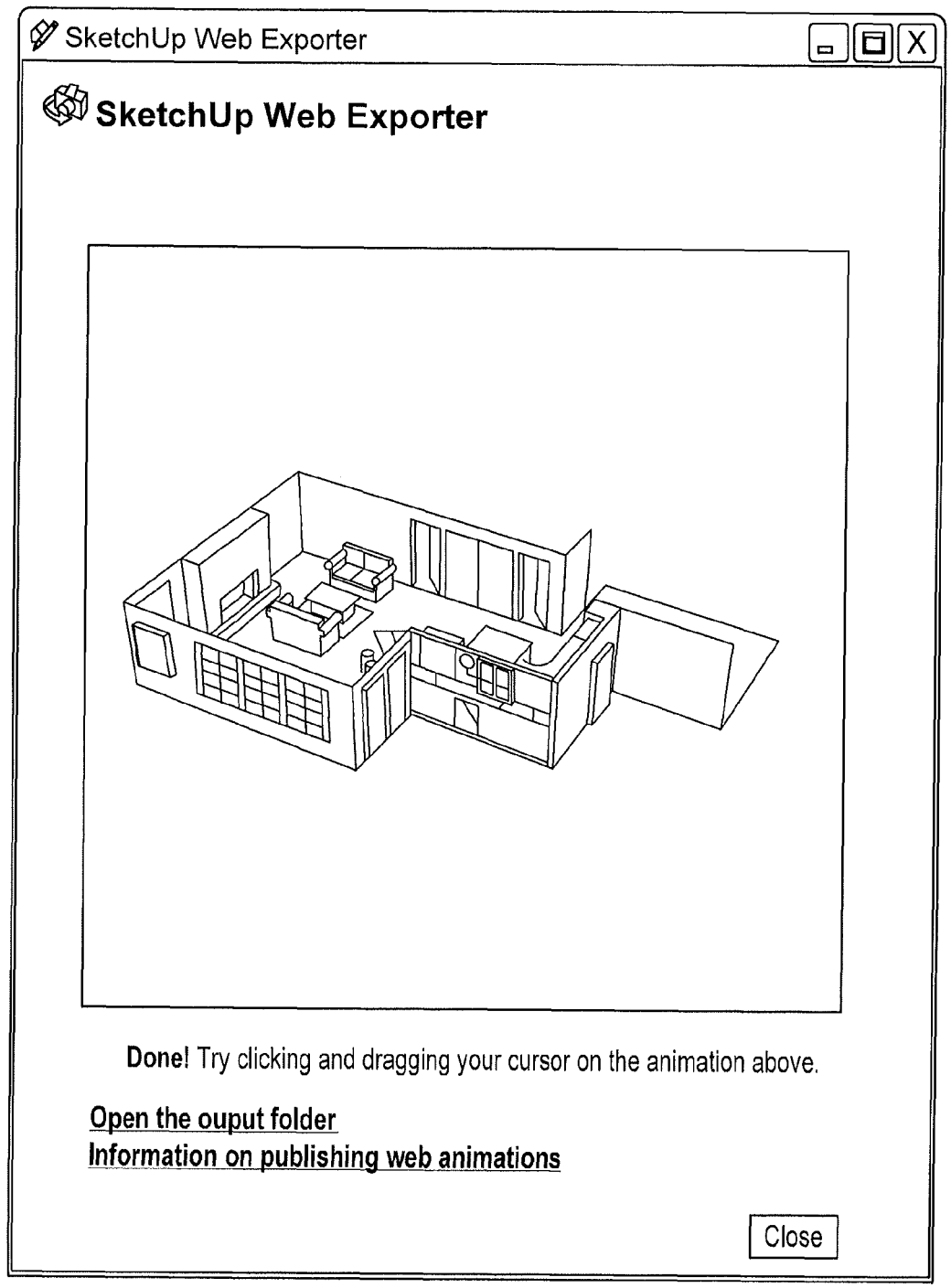

FIG. 8I shows a dialog box for exporting of files needed to review an animation that simulates a 3-D model. The dialog box shows one image of a model, and permits a user to place a cursor on the image and drag left and right to cause other images to be displayed in sequence. In such a manner, the user can seem to be pulling the model around so as to see it in a seeming 3-D state.

Figure 8J:
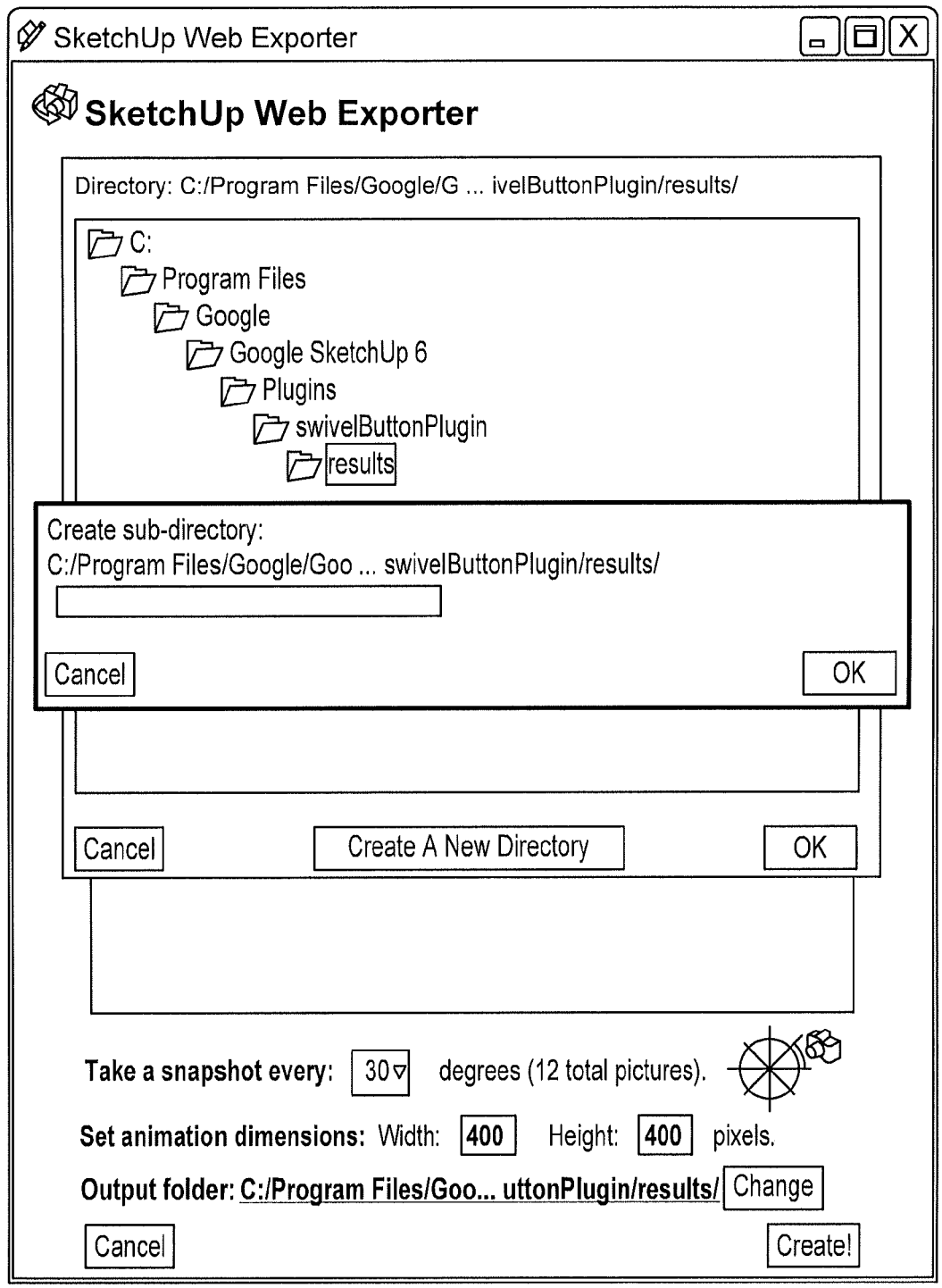

FIG. 8J shows a dialog box for creating a new sub-directory for saving files relating to a model. Such a dialog box is shown over the dialog box of FIG. 8H, and may be generated when a user selects the "Create a New Directory" control of the dialog box in FIG. 8H. Such creation of a new directory may be simulated by the dialog box of FIG. 8J, and may be achieved in reality by the program that generates the dialog box as part of a web browser communicating with a conduit application, such as in the manners discussed above.

Figure 9:
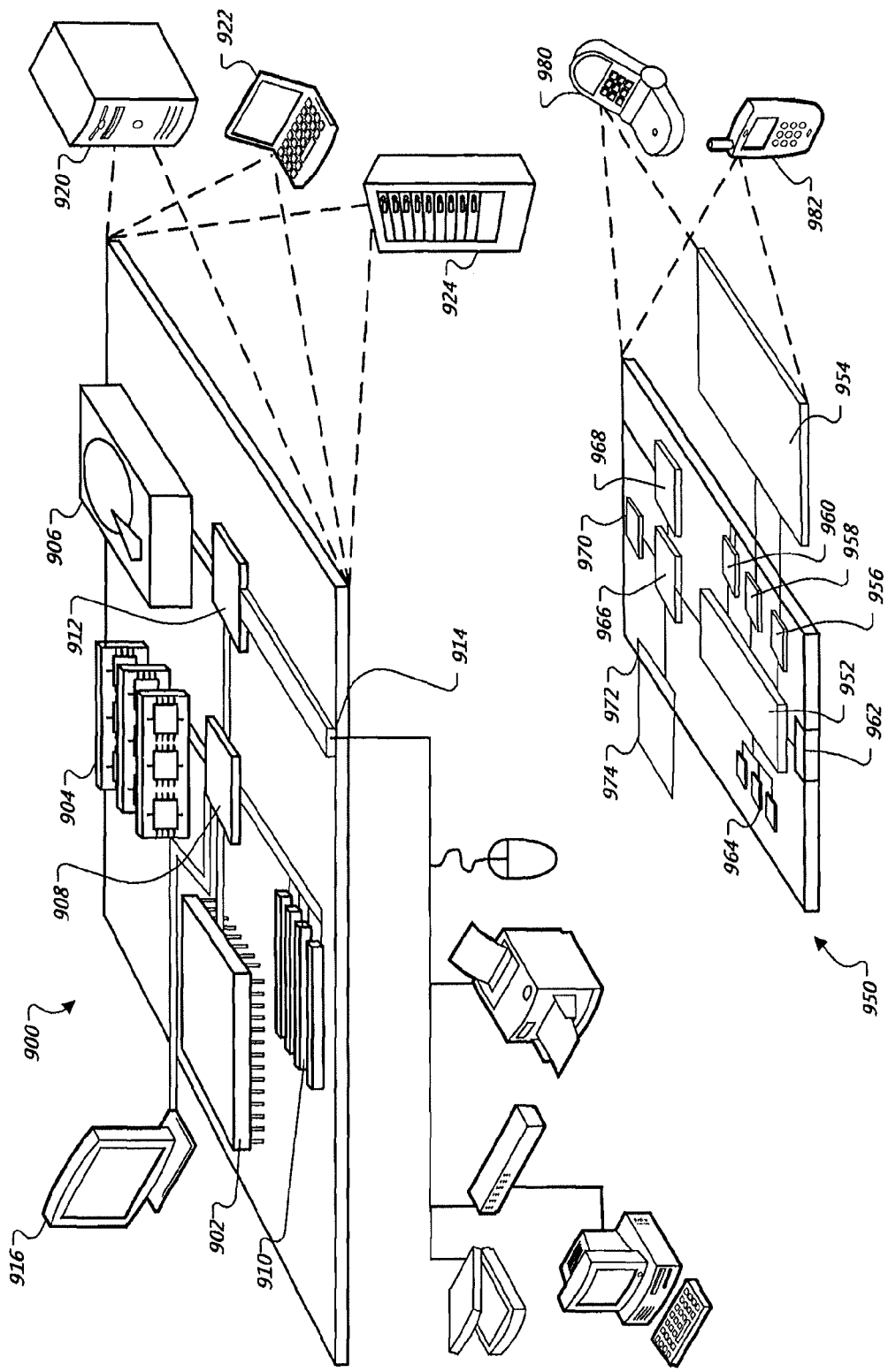
FIG. 9 shows an example of a computer device and a mobile computer device that can be used to implement the techniques described here.

FIG. 9 shows an example of a generic computer device 900 and a generic mobile computer device 950, which may be used with the techniques described here. Computing device 900 is intended to represent various forms of digital computers, such as laptops, desktops, workstations, personal digital assistants, servers, blade servers, mainframes, and other appropriate computers. Computing device 950 is intended to represent various forms of mobile devices, such as personal digital assistants, cellular telephones, smartphones, and other similar computing devices. The components shown here, their connections and relationships, and their functions, are meant to be exemplary only, and are not meant to limit implementations of the inventions described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, memory on processor 902, or a propagated signal.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 974 may also be provided and connected to device 950 through expansion interface 972, which may include, for example, a SIMM (Single In Line Memory Module) card interface. Such expansion memory 974 may provide extra storage space for device 950, or may also store applications or other information for device 950. Specifically, expansion memory 974 may include instructions to carry out or supplement the processes described above, and may include secure information also. Thus, for example, expansion memory 974 may be provide as a security module for device 950, and may be programmed with instructions that permit secure use of device 950. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 974, memory on processor 952, or a propagated signal that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 970 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smartphone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention. For example, much of this document has been described with respect to television advertisements, but other forms of future, viewership-based advertisements may also be addressed, such as radio advertisements and on-line video advertisements.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A computer implemented method comprising:
   receiving in a web browser one or more user inputs that designate points along a path around a three-dimensional model;
   obtaining, for each of the points along the path, a two-dimensional image of the three-dimensional model taken from the point along the path;
   storing the two-dimensional images in association with the three-dimensional model; and
   selecting a number of designated points to ensure a particular difference between the stored two-dimensional images.

2. The method of claim 1, further comprising:
   generating mark-up code for displaying image manipulation controls and for permitting display of the two-dimensional images;
   generating a progression of the two-dimensional images in response to a user interaction with the image manipulation controls; and
   providing the progression of the two-dimensional images and mark-up code for use by the web browser.

3. The method of claim 1, further comprising selecting equally spaced points along the path.

4. A computer implemented method comprising:
   receiving in a web browser one or more user inputs that designate points along a path around a three-dimensional model;
   obtaining, for each of the points along the path, a two-dimensional image of the three-dimensional model taken from the point along the path;
   storing the two-dimensional images in association with the three-dimensional model;
   providing code that when invoked by the web browser, displays a control for a user to choose an axis around which a viewpoint will rotate around the three-dimensional model;
   obtaining a progression of two-dimensional images corresponding to the viewpoint; and
   providing the progression of two-dimensional images corresponding to the viewpoint for display in the web browser.

5. A computer implemented method comprising:
   receiving in a web browser one or more user inputs that designate points along a path around a three-dimensional model;
   obtaining, for each of the points along the path, a two-dimensional image of the three-dimensional model taken from the point along the path;
   storing the two-dimensional images in association with the three-dimensional model; and
   wherein the designated points are selected to occur on a sphere surrounding the three-dimensional model.

6. A computer implemented method comprising:
   receiving in a web browser one or more user inputs that designate points along a path around a three-dimensional model;
   obtaining, for each of the points along the path, a two-dimensional image of the three-dimensional model taken from the point along the path;
   storing the two-dimensional images in association with the three-dimensional model;
   providing code that when invoked by the web browser, displays a control for a user to scan forward and backward through the two-dimensional images; and
   providing a progression of the two-dimensional images corresponding to the user scanning forward and backward through the two-dimensional images for display in the web browser.

7. A system comprising:
   one or more computers and one or more storage devices storing instructions that are operable, when executed by the one or more computers, to cause the one or more computers to perform operations comprising:
   receiving in a web browser one or more user inputs that designate points along a path around a three-dimensional model;
   obtaining, for each of the points along the path, a two-dimensional image of the three-dimensional model taken from the point along the path;
   storing the two-dimensional images in association with the three-dimensional model; and
   selecting a number of designated points to ensure a particular difference between the stored two-dimensional images.

8. The system of claim 7, further comprising:
   generating mark-up code for displaying image manipulation controls and for permitting display of the two-dimensional images;
   generating a progression of the two-dimensional images in response to a user interaction with the image manipulation controls; and
   providing the progression of the two-dimensional images and mark-up code for use by the web browser.

9. The system of claim 7, further comprising selecting equally spaced points along the path.

10. A system comprising:
one or more computers and one or more storage devices storing instructions that are operable, when executed by the one or more computers, to cause the one or more computers to perform operations comprising:
receiving in a web browser one or more user inputs that designate points along a path around a three-dimensional model;
obtaining, for each of the points along the path, a two-dimensional image of the three-dimensional model taken from the point along the path;
storing the two-dimensional images in association with the three-dimensional model;
providing code that when invoked by the web browser, displays a control for a user to choose an axis around which a viewpoint will rotate around the three-dimensional model;
obtaining a progression of two-dimensional images corresponding to the viewpoint; and
providing the progression of two-dimensional images corresponding to the viewpoint for display in the web browser.

11. A system comprising:
one or more computers and one or more storage devices storing instructions that are operable, when executed by the one or more computers, to cause the one or more computers to perform operations comprising:
receiving in a web browser one or more user inputs that designate points along a path around a three-dimensional model;
obtaining, for each of the points along the path, a two-dimensional image of the three-dimensional model taken from the point along the path;
storing the two-dimensional images in association with the three-dimensional model; and
wherein the designated points are selected to occur on a sphere surrounding the three-dimensional model.

12. A system comprising:
one or more computers and one or more storage devices storing instructions that are operable, when executed by the one or more computers, to cause the one or more computers to perform operations comprising:
receiving in a web browser one or more user inputs that designate points along a path around a three-dimensional model;
obtaining, for each of the points along the path, a two-dimensional image of the three-dimensional model taken from the point along the path;
storing the two-dimensional images in association with the three-dimensional model;
providing code that when invoked by the web browser, displays a control for a user to scan forward and backward through the two-dimensional images; and
providing a progression of the two-dimensional images corresponding to the user scanning forward and backward through the two-dimensional images for display in the web browser.

13. A non-transitory computer-readable medium storing software comprising instructions executable by one or more computers which, upon such execution, cause the one or more computers to perform operations comprising:
receiving in a web browser one or more user inputs that designate points along a path around a three-dimensional model;
obtaining, for each of the points along the path, a two-dimensional image of the three-dimensional model taken from the point along the path;
storing the two-dimensional images in association with the three-dimensional model; and
wherein the designated points are selected to occur on a sphere surrounding the three-dimensional model.

14. The medium of claim 13, further comprising:
generating mark-up code for displaying image manipulation controls and for permitting display of the two-dimensional images;
generating a progression of the two-dimensional images in response to a user interaction with the image manipulation controls; and
providing the progression of the two-dimensional images and mark-up code for use by the web browser.

15. The medium of claim 13, further comprising selecting equally spaced points along the path.

16. A non-transitory computer-readable medium storing software comprising instructions executable by one or more computers which, upon such execution, cause the one or more computers to perform operations comprising:
receiving in a web browser one or more user inputs that designate points along a path around a three-dimensional model;
obtaining, for each of the points along the path, a two-dimensional image of the three-dimensional model taken from the point along the path;
storing the two-dimensional images in association with the three-dimensional model; and
selecting a number of designated points to ensure a particular difference between the stored two-dimensional images.

17. A non-transitory computer-readable medium storing software comprising instructions executable by one or more computers which, upon such execution, cause the one or more computers to perform operations comprising:
receiving in a web browser one or more user inputs that designate points along a path around a three-dimensional model;
obtaining, for each of the points along the path, a two-dimensional image of the three-dimensional model taken from the point along the path;
storing the two-dimensional images in association with the three-dimensional model;
providing code that when invoked by the web browser, displays a control for a user to choose an axis around which a viewpoint will rotate around the three-dimensional model;
obtaining a progression of two-dimensional images corresponding to the viewpoint; and
providing the progression of two-dimensional images corresponding to the viewpoint for display in the web browser.

* * * * *